(12) United States Patent
Jiang et al.

(10) Patent No.: US 12,527,238 B2
(45) Date of Patent: Jan. 13, 2026

(54) RESISTIVE RANDOM ACCESS MEMORY DEVICE WITH IMPROVED BOTTOM ELECTRODE

(71) Applicant: Taiwan Semiconductor Manufacturing Company, Ltd., Hsinchu (TW)

(72) Inventors: Jheng-Hong Jiang, Hsinchu (TW); Chung-Liang Cheng, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 400 days.

(21) Appl. No.: 18/173,815

(22) Filed: Feb. 24, 2023

(65) Prior Publication Data

US 2024/0164225 A1 May 16, 2024

Related U.S. Application Data

(60) Provisional application No. 63/383,506, filed on Nov. 13, 2022.

(51) Int. Cl.
*H10N 70/00* (2023.01)
*H10B 63/00* (2023.01)

(52) U.S. Cl.
CPC ......... *H10N 70/8418* (2023.02); *H10B 63/34* (2023.02); *H10N 70/063* (2023.02); *H10N 70/883* (2023.02)

(58) Field of Classification Search
CPC ............ H10N 70/8418; H10N 70/883; H10N 70/063; H10B 63/34
See application file for complete search history.

(56) References Cited

U.S. PATENT DOCUMENTS

2019/0067373 A1* 2/2019 Yang .................... H10N 70/826
2021/0066591 A1* 3/2021 Trinh ................. H10N 70/8833

* cited by examiner

*Primary Examiner* — Timor Karimy
(74) *Attorney, Agent, or Firm* — KILPATRICK TOWNSEND & STOCKTON LLP

(57) ABSTRACT

A resistive random access memory (RRAM) device is provided. The RRAM includes: a bottom electrode via disposed in a first dielectric layer; a bottom electrode electrically connected to the bottom electrode via and protruding upwardly from the bottom electrode via in a vertical direction, wherein the bottom electrode has a tapered shape and includes a base portion extending upwardly from a bottom surface to an interface and a tip portion extending upwardly from the interface to a top surface; a top electrode disposed in a second dielectric layer, the top electrode distanced above and vertically aligned with the bottom electrode; and a switching layer disposed between the first dielectric layer and the second dielectric layer, the switching layer enclosing the bottom electrode, wherein a conductive path between the bottom electrode and the top electrode is formed when a forming voltage is applied.

13 Claims, 14 Drawing Sheets

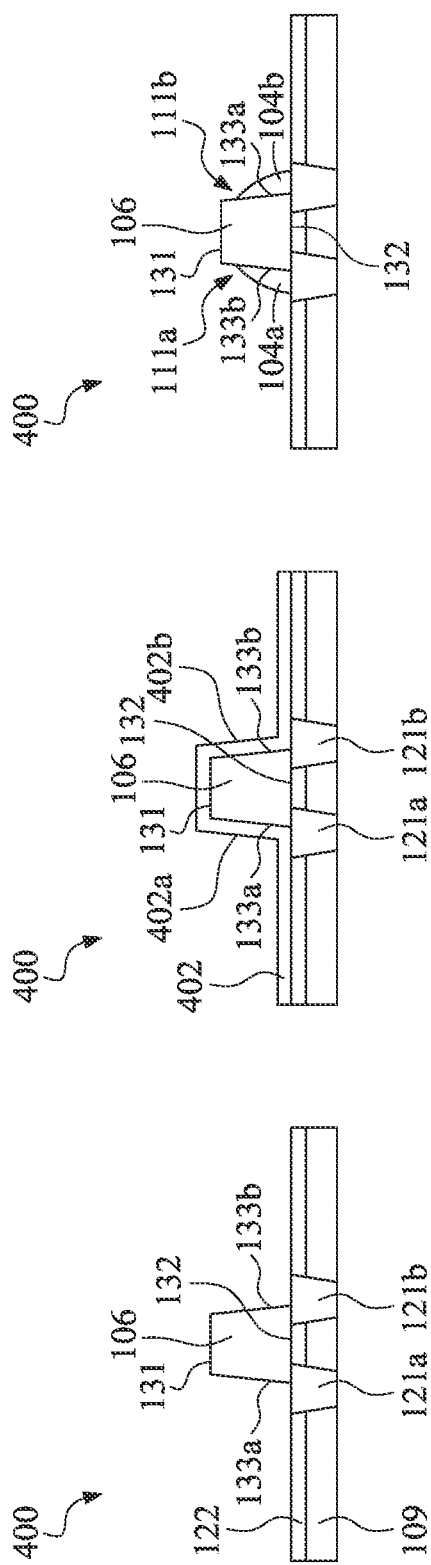
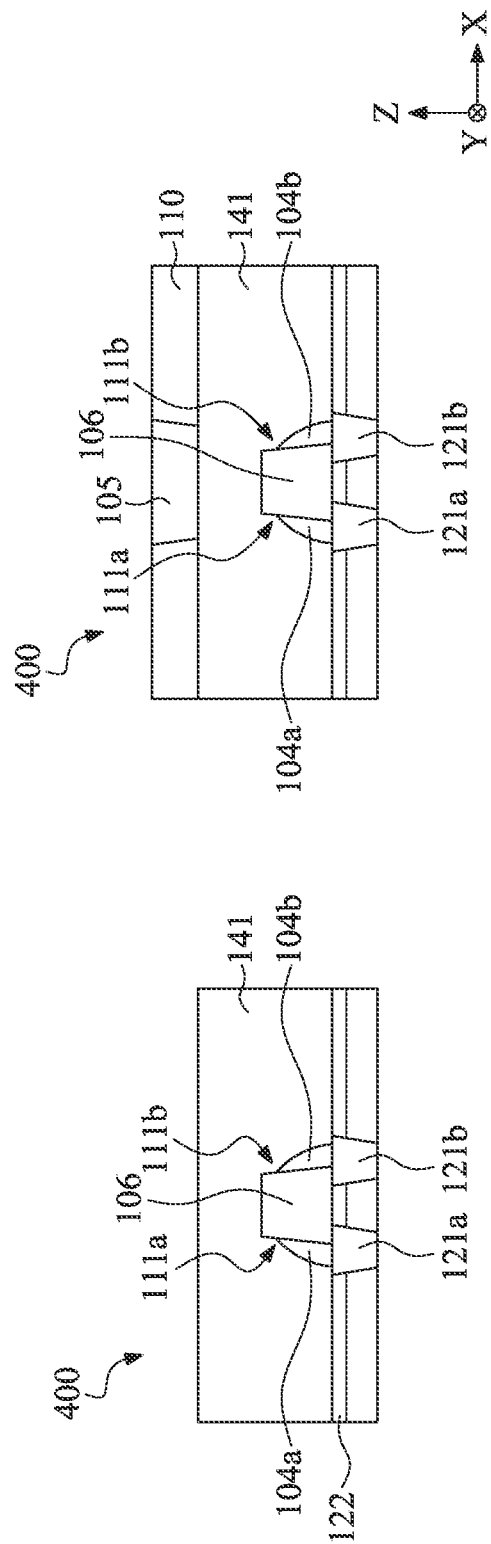

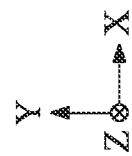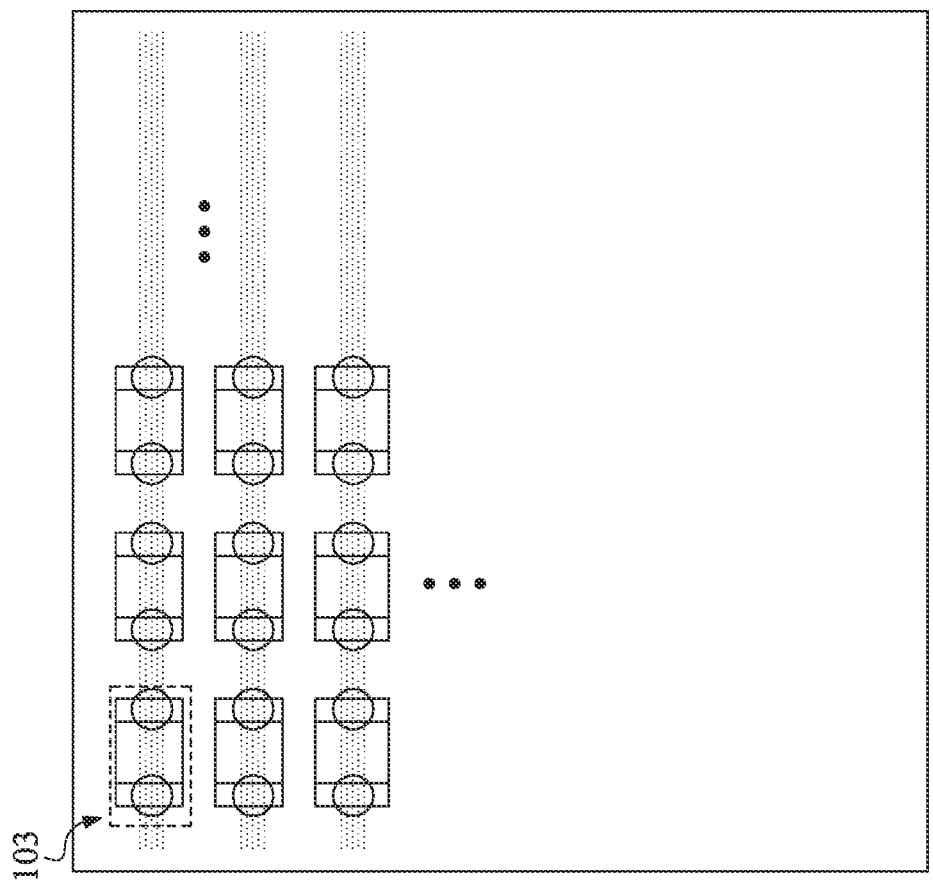
Fig. 7

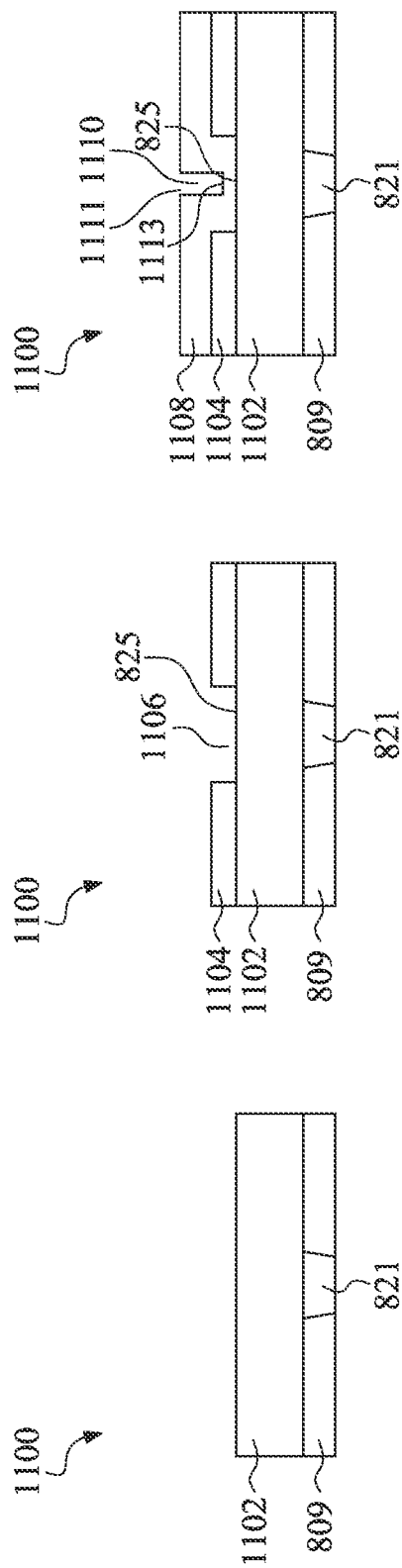
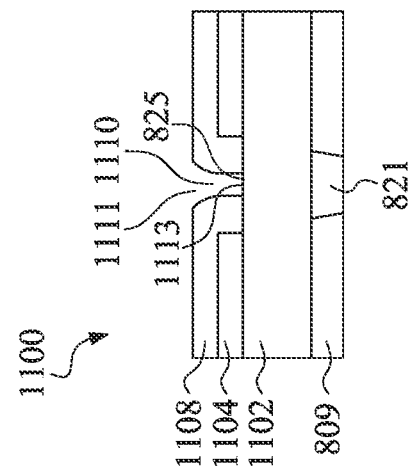

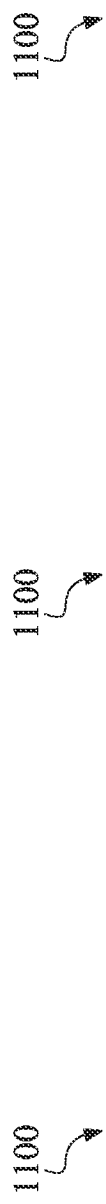
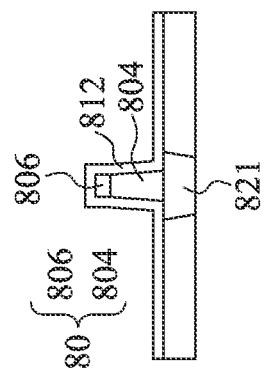
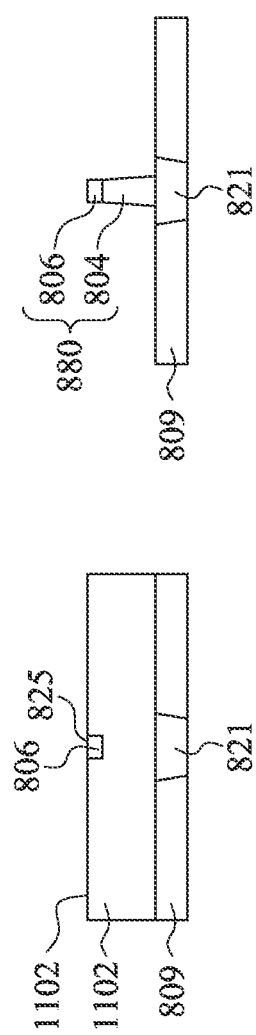
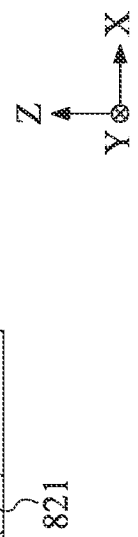
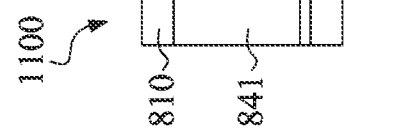
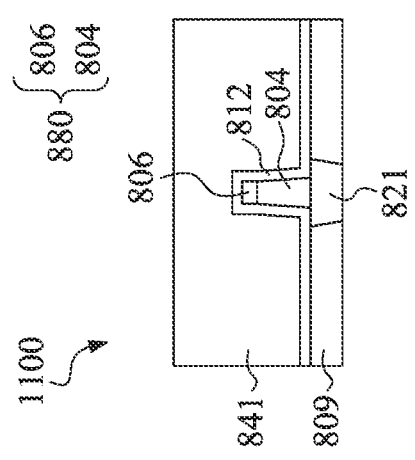
Fig. 11F
Fig. 11G
Fig. 11H
Fig. 11I
Fig. 11J

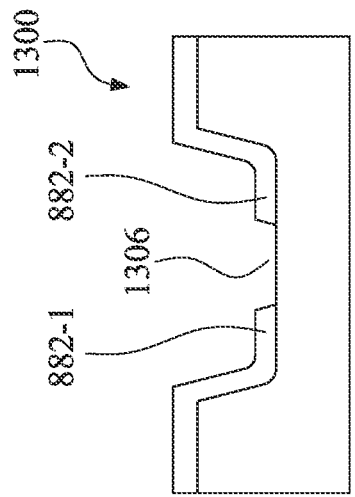
Fig. 13A
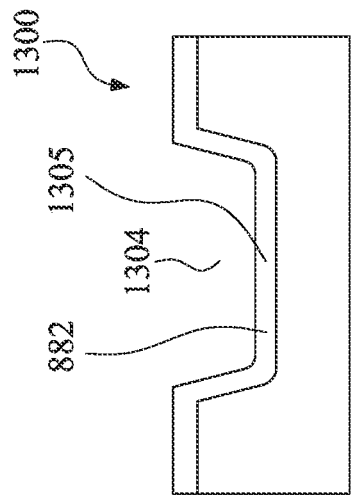
Fig. 13B
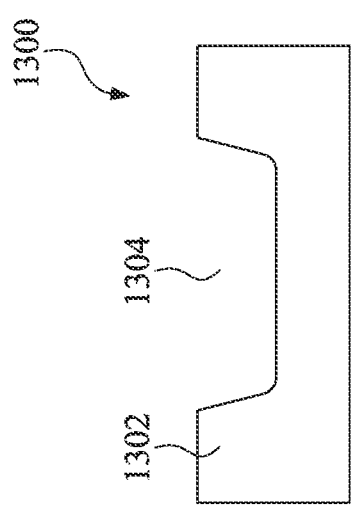
Fig. 13C
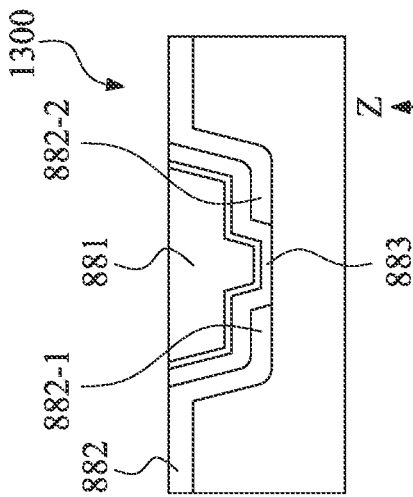
Fig. 13D
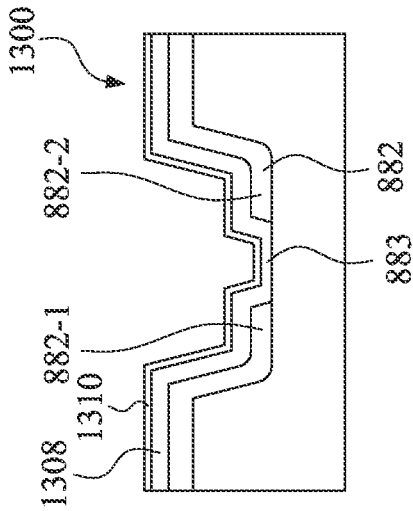
Fig. 13E
Fig. 13F

RESISTIVE RANDOM ACCESS MEMORY DEVICE WITH IMPROVED BOTTOM ELECTRODE

FIELD

Embodiments of the present disclosure relate generally to memory devices, and more particularly to resistive random access memory (RRAM) devices.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, and so on. Moreover, RRAM implementations could be very useful hardware for running artificial intelligence (AI) and machine learning (ML) applications due to the increasing computational demands necessary for many improvements in AI and ML.

Therefore, there is a need to improve the performance of RRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4E are schematic diagrams illustrating cross-sectional views of an RRAM device at various fabrication stages in accordance with some embodiments.

FIG. 7 is a schematic diagram illustrating an example layout of an array of RRAM devices in accordance with some embodiments.

FIGS. 11A-11J are schematic diagrams illustrating cross-sectional views of an RRAM device at various fabrication stages in accordance with some embodiments.

FIGS. 13A-13F are schematic diagrams illustrating cross-sectional views of a thin-film transistor (TFT) at various fabrication stages in accordance with some embodiments.

DETAILED DESCRIPTION OF THE INVENTION

Figure 1:
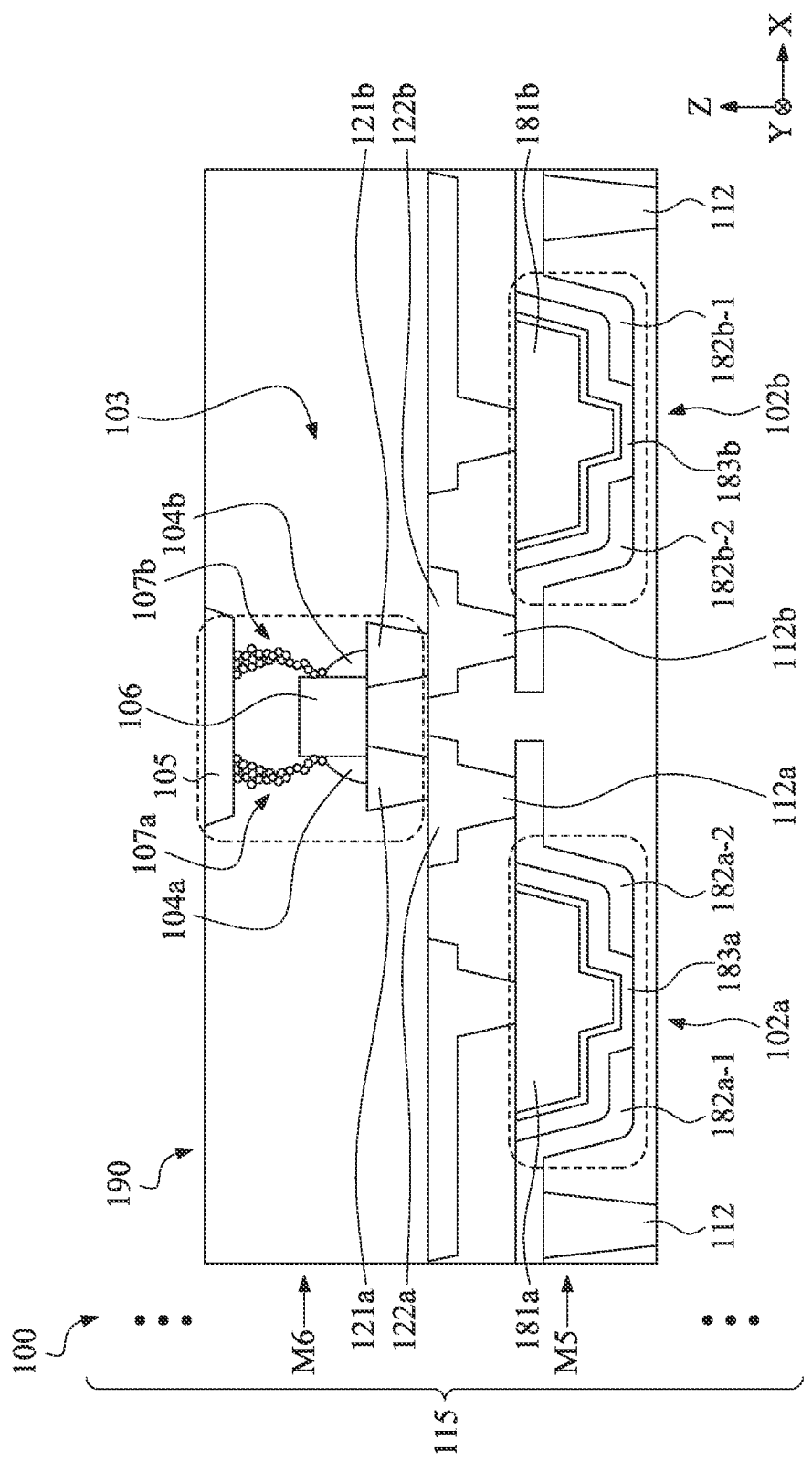
FIG. 1 is a schematic diagram illustrating a cross-sectional view of an example integrated circuit device including an RRAM device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Resistive random access memory (RRAM) is a type of nonvolatile memory (NVM) that works by changing the resistance across a dielectric solid-state material. RRAM devices are configured to store data by switching between different resistance states, for example, a high resistance state (HRS) and a low resistance state (LRS), corresponding to different data states.

To enable such "resistive switching," RRAM devices have a bottom electrode that is separated from a top electrode by a switching layer (sometimes referred to as a "data storage layer") having a variable resistance. The switching layer is a dielectric layer. Resistive switching allows for an RRAM device to change an electrical resistance of the switching layer between a high resistance state (HRS) corresponding to a first data state (e.g., a "logic 0") and a low resistance state (LRS) corresponding to a second data state (e.g., a "logic 1").

The switching layer typically comprises a high-κ dielectric material that is able to alter its internal resistance in response to an applied bias. There is a wide range of high-κ dielectric materials that can be used in RRAM devices. Different high-κ dielectric materials provide RRAM devices with different characteristics. For example, some high-κ dielectric materials may offer good endurance, while other high-κ dielectric materials may offer good data retention. Some examples of high-κ dielectric materials include metal oxides such as aluminum oxide ($Al_2O_3$).

When a sufficiently high voltage (often referred to as "$V_{forming}$") is applied to the switching layer, oxygen ions move out of the switching layer, and the remaining oxygen vacancies form a conductive path (often referred to as a "filament") in the switching layer. The filament serves as a bridge between the top electrode and the bottom electrode, thus placing the RRAM device in the low resistance state (LRS). Once a filament is formed, it can be broken (referred to as the "reset" operation), resulting in the high resistance state (HRS), or regenerated (referred to as the "set" operation), resulting in the low resistance state (LRS).

There are, however, some challenges with the conventional RRAM devices. First, the filament generated has a large variation. The top electrode and the bottom electrode usually are flat and have comparable sizes. As a result, the filament can possibly occur at various locations and have various geometries. In some cases, there may be multiple filaments in the switching layer. In other words, the filament is not very predictable and cannot be controlled easily. The unpredictability negatively impacts the endurance and data retention in an RRAM device.

Second, the number of oxygen ions in an RRAM device usually decreases after frequent resistive switching operations. The oxygen ions in an RRAM device also diffuse, over time, into other regions due to a gradient in concentration. As the number of oxygen ions decreases, it becomes harder to break the filament (i.e., harder to reset the RRAM device). Accordingly, the endurance of the RRAM device is impacted by the loss of oxygen ions, and the data retention of the RRAM device deteriorates, limiting its usage in high-performance applications.

Additionally, although RRAM devices have the advantage of much faster switching speed than technologies such as NAND flash memories, conventional RRAM devices are more expensive. Therefore, it is desirable to reduce the cost per bit of RRAM devices.

In accordance with some aspects of the disclosure, an improved RRAM device having two tapered bottom electrodes and corresponding fabrication methods are introduced for addressing the aforementioned challenges resulted from the filament variations. In some embodiment, the RRAM device includes a top electrode, a switching layer, a hard mask structure, and two bottom electrodes isolated by the hard mask structure. The two isolated bottom electrodes are tapered, and each of them has a tip pointing toward the top electrode. As such, the RRAM device can be regarded as two RRAM devices that share the top electrode and the switching layer.

Due to the tapered shape of the bottom electrodes, a point discharge occurs when a filament is formed by applying a forming voltage to one of the isolated bottom electrodes. Since the tip has a large curvature, the electrical field around the tip is larger than that of a conventional top electrode, given the same voltage. As a result, it becomes easier to break down the switching layer to form the filament. The formation of the filament is more predictable and controllable. Moreover, since the RRAM device can be regarded as two RRAM devices that share the bottom electrode and the switching layer, the areal density has been increased by storing two bits of information instead of one bit of information.

In accordance with other aspects of the disclosure, an improved RRAM device having a tapered bottom electrode and corresponding fabrication methods are introduced for addressing the aforementioned challenges resulted from the filament variations. In some embodiment, the improved RRAM device has a bottom electrode protruding from a dielectric layer and extending upwardly, in a vertical direction, into the switching layer above the dielectric layer. The bottom electrode has a tapered shape and includes a tip portion having a large curvature. In some embodiments, the RRAM device further includes an oxygen-rich dielectric layer covering the bottom electrode.

Due to the tapered shape of the bottom electrode, a point discharge occurs when a filament is formed by applying a forming voltage to the bottom electrode. Since the tip portion has a large curvature, the electrical field around the tip is larger than that of a conventional top electrode, given the same voltage. As a result, it becomes easier to break down the switching layer to form the filament. The formation of the filament is more predictable and controllable.

In addition, the oxygen-rich dielectric layer is a layer with a relatively high concentration of oxygen ions. In one embodiment, the oxygen-rich dielectric layer has a concentration of oxygen ions higher than a threshold concentration. As such, the oxygen-rich dielectric layer can have enough oxygen ions to compensate for the loss of oxygen ions after frequent switching operations. As a result, the endurance and data retention in the RRAM device is improved significantly.

Moreover, the distance between the tip portion of the bottom electrode and the top electrode becomes smaller because the tip portion is above the interface between the dielectric layer and the switching layer. As a result, the operation voltage to break down the switching layer (i.e., to form the filament) becomes smaller, therefore resulting in a lower power assumption.

Example RRAM Devices with Tapered Bottom Electrodes

Figure 2:
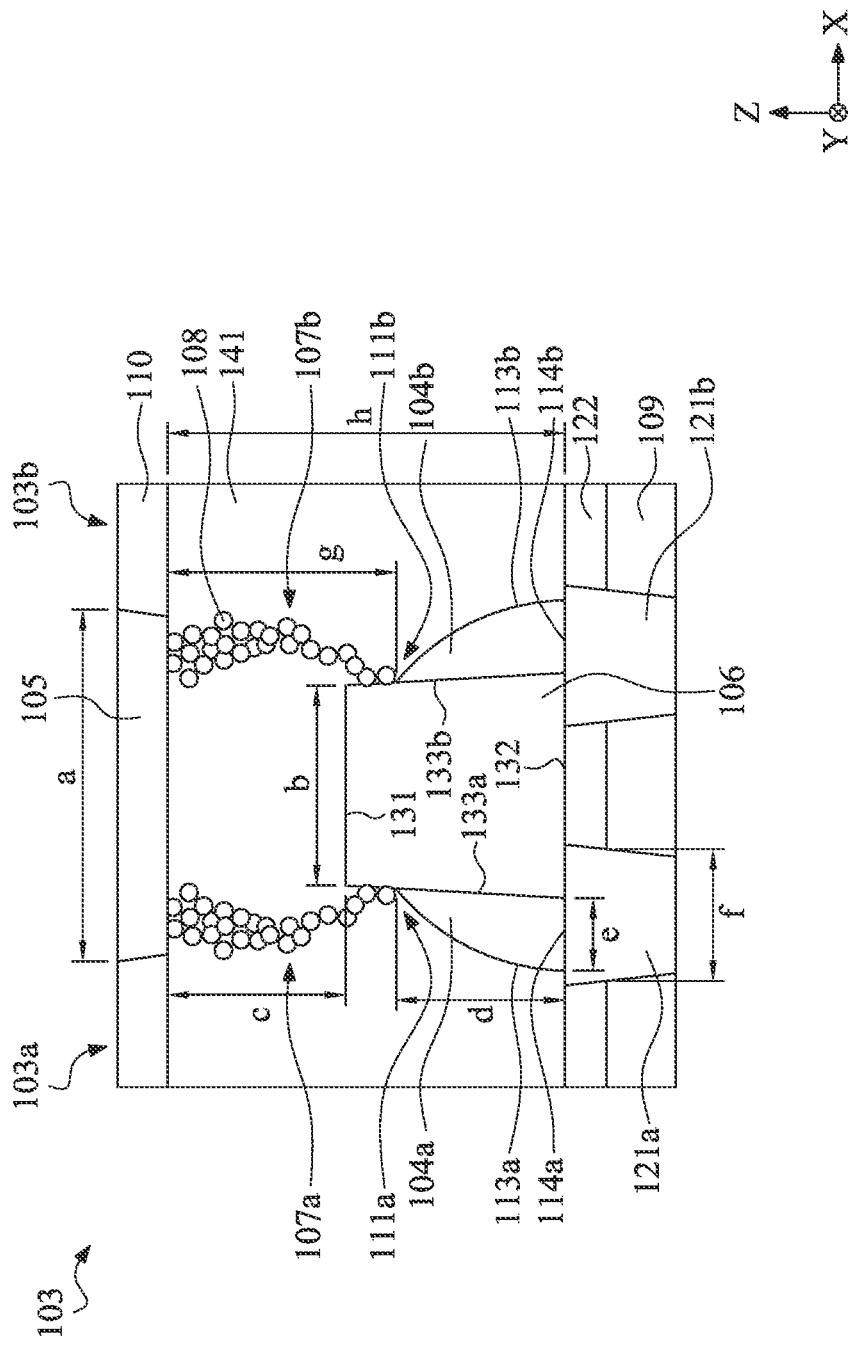
FIG. 2 is a schematic diagram illustrating a cross-sectional view of the example RRAM device shown in FIG. 1 in accordance with some embodiments.

FIG. 1 is a schematic diagram illustrating a cross-sectional view of an example integrated circuit device 100 including an RRAM device 103 in accordance with some embodiments. In the illustrated example, the integrated circuit device 100 includes an RRAM cell 190, which includes the RRAM device 103, a first thin-film transistor (TFT) 102a, and a second TFT 102b. In other embodiments, an integrated circuit device includes multiple RRAM cells arranged in rows and columns. The RRAM device 103 includes two isolated bottom electrodes (i.e., a first bottom electrode 104a and a second bottom electrode 104b) instead of a conventional bottom electrode to address the aforementioned challenges resulted from the filament variations. Additionally, both the first RRAM device 103a and the second RRAM device 103b increase areal density, which is a measure of the quantity of information bits that can be stored in a given area. The RRAM device 103 also includes a top electrode 105, a hard mask structure 106, a switching layer 141 (as shown in FIG. 2), two isolated bottom electrode vias (i.e., a first bottom electrode via 121a and a second bottom electrode via 121b). A portion of the switching layer 141 is disposed between the top electrode 105 and the two isolated bottom electrodes (i.e., the first RRAM device 103a and the second RRAM device 103b). The first bottom electrode via 121a is electrically connected to the first bottom electrode 104a. The second bottom electrode via 121b is electrically connected to the second bottom electrode 104b.

It is noted that the RRAM device 103 can be considered as two separate RRAM devices (i.e., a first RRAM device 103a and a second RRAM device 103b, as shown in FIG. 2) that share the top electrode 105. As explained above, the electrical resistance of the switching layer 141 can be changed between a high resistance state (HRS) and a low resistance state (LRS). Details of the structure of the RRAM device 103 will be described below with reference to FIG. 2, whereas details of the fabrication of the RRAM device 103 will be described below with reference to FIGS. 3-4E.

In the illustrated example, the integrated circuit device 100 includes an interconnect structure 115 formed over a substrate. The interconnect structure 115 includes multiple inter-level dielectric (ILD) layers interleaved with metallization layers. The metallization layers are commonly identified as the M1 metallization layer, the M2 metallization layer, the M3 metallization layer, the M4 metallization layer, the M5 metallization layer, the M6 metallization layer, and so on. Each metallization layer may include multiple metal features. For example, the M6 metallization layer has a first metal feature 122a and a second metal feature 122b, as shown in FIG. 1.

In the example shown in FIG. 1, the RRAM device 103 is disposed and fabricated in the M6 metallization layer; the first TFT 102a and the second TFT 102b are disposed and fabricated in the M5 metallization layers. It should be understood that this is exemplary rather than limiting, and one of ordinary skill in the art would recognize many variations, modifications, and alternatives. In some embodiments, the first TFT 102a and the second TFT 102b are disposed in an adjacent (i.e., either immediately above or immediately below) metallization layer of the metallization layer where the RRAM device 103 is disposed.

In the illustrated example, the first bottom electrode via 121a is electrically connected to the first metal feature 122a, and the second bottom electrode via 121b is electrically connected to the second metal feature 122b.

In the illustrated example, the first TFT 102a and the second TFT 102b are used as access transistors. It should be noted that the TFTs 102a and 102b are only one example of the access transistors, and other types of transistors (e.g., FinFETs) are within the scope of the disclosure. As shown in FIG. 1, the first TFT 102a includes, among other things, a gate 181a, a first source/drain (S/D) region 182a-1, a second S/D region 182a-2, and a channel 183a. Likewise, the second TFT 102b includes, among other things, a gate 181b, a first S/D region 182b-1, a second S/D region 182b-2, and a channel 183b.

A first contact 112a connects the second S/D region 182a-2 of the first TFT 102a to the first metal feature 122a. As such, the first TFT 102a is electrically connected to the first bottom electrode 104a of the RRAM device 103, through the first contact 112a, the first metal feature 122a, and the first bottom electrode via 121a.

Likewise, a second contact 112b connects the second S/D region 182b-2 of the second TFT 102b to the second metal feature 122b. As such, the second TFT 102b is electrically connected to the second bottom electrode 104b of the RRAM device 103, through the second contact 112b, the second metal feature 122b, and the second bottom electrode via 121b.

The first S/D region 182a-1 of the first TFT 102a is connected, directly or indirectly, to a first source line; the first S/D region 182b-1 of the second TFT 102b is connected, directly or indirectly, to a second source line. The gate 181a of the TFT 102a and the gate 181b of the TFT 102b are electrically connected to, for example, a common word line. The top electrode 105 of the RRAM device 103 is electrically connected, directly or indirectly, to a bit line.

FIG. 2 is a schematic diagram illustrating the example RRAM device 103 shown in FIG. 1 in accordance with some embodiments. In the illustrated example, as mentioned above, the RRAM device 103 includes, among other things, the top electrode 105, the switching layer 141, the first bottom electrode 104a, the second bottom electrode 104b, the hard mask structure 106, the first bottom electrode via 121a, and the second bottom electrode via 121b. As mentioned above, the RRAM device 103 can be considered as two separate RRAM devices (i.e., the first RRAM device 103a and the second RRAM device 103b).

In the illustrated example, a stop layer 122 is disposed on a first dielectric layer 109. The first bottom electrode via 121a and the second bottom electrode via 121b are disposed in the stop layer 122 and the first dielectric layer 109. The hard mask structure 106 is disposed on the stop layer 122. The hard mask structure 106 extends vertically from a top surface 131 to a bottom surface 132. The bottom surface 132 is in contact with the stop layer 122. The bottom surface 132 also partially covers the first bottom electrode via 121a and the second bottom electrode via 121b. The hard mask structure 106 has two side walls (i.e., a first side wall 133a and a second side wall 133b), each connecting the top surface 131 and the bottom surface 132.

In the example shown in FIG. 2, the first bottom electrode 104a and the second bottom electrode 104b are isolated by the hard mask structure 106 and are disposed on the first side wall 133a and the second side wall 133b, respectively. In some embodiments, the first bottom electrode 104a and the second bottom electrode 104b are symmetric or substantially symmetric with respect to the vertical direction (i.e., the Z-direction shown in FIG. 2).

The first bottom electrode 104a extends vertically from a first tip 111a to a first electrode bottom surface 114a. The first bottom electrode 104a has a first outer surface 113a connecting the first tip 111a and the first electrode bottom surface 114a. In some embodiments, the first outer surface 113a is flat or substantially flat. In other embodiments, the first outer surface 113a is curved, for example, concave or convex. The first electrode bottom surface 114a is in contact with the first bottom electrode via 121a and is coplanar with the bottom surface 132 of the hard mask structure 106. The first tip 111a is pointing toward the top electrode 105. In some embodiments, the first tip 111a is below the top surface 131 of the hard mask structure 106.

Similar to the first bottom electrode 104a, the second bottom electrode 104b extends vertically from a second tip 111b to a second electrode bottom surface 114b. The second bottom electrode 104b has a second outer surface 113b connecting the second tip 111b and the second electrode bottom surface 114b. The second electrode bottom surface 114b is in contact with the second bottom electrode via 121b and is coplanar with the bottom surface 132 of the hard mask structure 106. The second tip 111b is pointing toward the top electrode 105.

In the example shown in FIG. 2, the first bottom electrode 104a has a tapered shape. The first bottom electrode 104a has a horizontal dimension (i.e., in the X-Y plane shown in FIG. 2) gradually decreasing upwardly in the vertical direction (i.e., the Z-direction shown in FIG. 2) from the first electrode bottom surface 114a to the first tip 111a. In some embodiments, the first bottom electrode 104a has a needle-like shape, and the first tip 111a has a sharp peak. It should be noted that a needle-like shape is one example of a tapered shape, though the terms "needle-like-shaped" and "tapered" may be used interchangeably in the disclosure. Similarly, the second bottom electrode 104b also has a tapered shape or a needle-like shape with a horizontal dimension gradually decreasing upwardly in the vertical direction from the second electrode bottom surface 114b to the second tip 111b.

In the illustrated example of FIG. 2, the switching layer 141 is disposed on the stop layer 122 and completely encloses the hard mask structure 106, the first RRAM device 103a, and the second RRAM device 103b. As such, the switching layer 141 is in contact with the first outer surface 113a of the first bottom electrode 104a, the second outer surface 113b of the second bottom electrode 104b, and the top surface 131 of the hard mask structure 106, respectively.

In the illustrated example of FIG. 2, a second dielectric layer 110 is disposed on the switching layer 141. The top electrode 105 is disposed in the second dielectric layer 110. The top electrode 105 extends downwardly through an entire thickness of the top electrode 105 in the vertical direction and is in contact with the switching layer 141. The top electrode 105 is aligned with the hard mask structure 106 in the vertical direction and is opposed to the first RRAM device 103a and the second RRAM device 103b.

Due to the tapered shape of the first bottom electrode 104a, a point discharge occurs when a first filament 107a is formed by applying a forming voltage ($V_{forming}$) to the first bottom electrode 104a. Likewise, due to the tapered shape of the second bottom electrode 104b, a point discharge occurs when a second filament 107b is formed by applying a forming voltage ($V_{forming}$) to the second bottom electrode 104b. In other words, the resistance states of the first RRAM device 103a and the second RRAM device 103b can be switched independently.

In the illustrated example shown in FIG. 2, the first filament 107a and the second filament 107b correspond to the remaining oxygen vacancies 108. Since the first tip 111a and the second tip 111b both have a sharp peak, the electrical fields around the first tip 111a and the second tip 111b are larger than that of a conventional bottom electrode. As a result, it becomes easier to break down the switching layer 141 to form the first filament 107a and the second filament 107b. In other words, it becomes easier to form the first filament 107a between the first tip 111a and the top electrode 105 and the second filament 107b between the second tip 111b and the top electrode 105, as compared to forming a filament between a conventional electrode, which is a flat electrode, and the top electrode 105. Accordingly, the formation of the filaments 107a and 107b is more predictable and controllable. As a result, the endurance and data retention in the RRAM device 103 is improved significantly.

Also, since the resistance states of the first RRAM device 103a and the second RRAM device 103b can be switched independently, two bits instead of one bit of information can be stored in the RRAM device 103, which increases the areal density of the RRAM device 103. Given the same storage capacity, the chip area of an RRAM chip including RRAM devices 103 arranged in rows and columns is smaller, thus reducing the fabrication cost of the RRAM chip. The reduced fabrication cost makes the RRAM technologies, which bear the advantages such as fast switching speed and better endurance, more accessible and affordable.

As shown in FIG. 2, the top electrode 105 of the RRAM device 103 has a width a in the horizontal direction (i.e., the X-direction shown in FIG. 2); the hard mask structure 106 has a width b, measured from the first side wall 133a to the second side wall 133b in the horizontal direction; the switching layer 141 has a thickness h in the vertical direction (i.e., the Z-direction shown in FIG. 2); a distance c is between the top electrode 105 and the hard mask structure 106 in the vertical direction (i.e., the Z-direction shown in FIG. 2); the first filament 107a and the second filament 107b each have a filament height g, measured between the top electrode 105 and the tips 111a and 111b in the vertical direction (i.e., the Z-direction shown in FIG. 2); the first bottom electrode 104a and the second bottom electrode 104b each have a height d in the vertical direction (i.e., the Z-direction shown in FIG. 2); the first bottom electrode 104a and the second bottom electrode 104b each have a bottom width e in the horizontal direction (i.e., the X-direction shown in FIG. 2); the first bottom electrode via 121a and the second bottom electrode via 121b each have a width f in the horizontal direction (i.e., the X-direction shown in FIG. 2).

In one embodiment, a is at least about 2 nm. In one embodiment, b is at least about 2 nm. In one embodiment, a relationship between a and b is a>b. In one embodiment, c is at least about 2 nm. In one embodiment, d is at least about 1 nm. In one embodiment, e is at least about 0.5 nm. In one embodiment, f is at least 1 nm. In one embodiment, a relationship between e and f is f>e. In one embodiment, a ratio of g to h (denoted as "g/h") is from about 10% to about 40%. In one embodiment, a ratio of a to e (denoted as "a/e") is at least 4.

Figure 3:
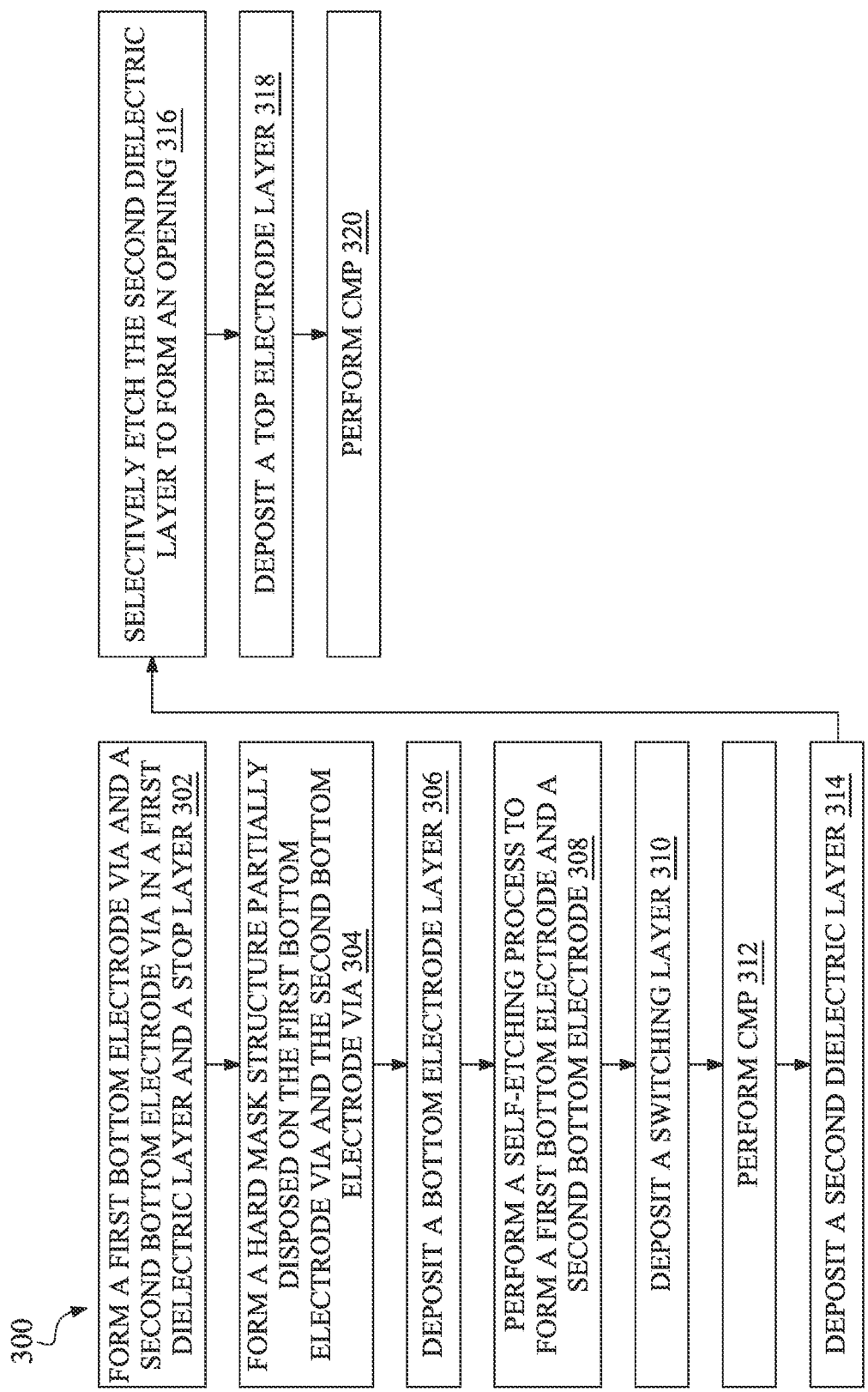
FIG. 3 is a flowchart diagram illustrating an example method of fabricating an RRAM device in accordance with some embodiments.

FIG. 3 is a flowchart diagram illustrating an example method 300 of fabricating an RRAM device in accordance with some embodiments. FIGS. 4A-4E are schematic diagrams illustrating cross-sectional views of an RRAM device 400 at various fabrication stages in accordance with some embodiments. In some embodiments, the RRAM device 400 may be included in a microprocessor, memory cell, and/or other integrated circuits. Also, FIGS. 4A-4E are simplified for a better understanding of the concepts of the present disclosure. For example, although FIGS. 4A-4E illustrate the RRAM device 400, it is understood the integrated circuit, in which the RRAM device 400 is formed, may include a number of other devices including resistors, capacitors, inductors, fuses, and the like, which are not shown in FIGS. 4A-4E, for purposes of clarity of illustration.

In the illustrated example of FIG. 3, the method 300 includes operations 302, 304, 306, 308, 310, 312, 314, 316, 318, and 320. Additional operations may be performed. Also, it should be understood that the sequence of the various operations discussed above with reference to FIG. 3 is provided for illustrative purposes, and as such, other embodiments may utilize different sequences. These various sequences of operations are to be included within the scope of embodiments.

The method 300 starts at operation 302. At operation 302, a first bottom electrode via and a second bottom electrode via are formed in a first dielectric layer and a stop layer. In the illustrated example of FIG. 4A, the stop layer 122 is disposed on the first dielectric layer 109. A first opening and a second opening are formed in the first dielectric layer 109 and the stop layer 122. A metal layer is formed on the stop layer 122 and fill in the first and second openings. A chemical-mechanical planarization (CMP) process is performed on the metal layer until the stop layer 122 is polished out (i.e., exposed). As such, a first bottom electrode via 121a and a second bottom electrode via 121b are formed in the first opening and the second opening, respectively. In some embodiments, the stop layer 122 includes silicon oxide, undoped silicate glass (USG), silicon nitride (SiN), silicon carbide (SiC), or a similar composite dielectric film. In some embodiments, the first bottom electrode via 121a and the second bottom electrode via 121b include a metal such as copper (Cu), aluminum (Al), or aluminum-copper (AlCu) alloy.

In some implementations, the first dielectric layer and the stop layer are formed by a deposition technique (e.g., physical vapor deposition (PVD), chemical vapor deposition (CVD), plasma-enhanced CVD (PECVD), atomic layer deposition (ALD), sputtering, etc.) to a predetermined thickness range. In some implementations, the first and second openings are formed by a selective etching process (i.e., a patterning and etching process) using a mask. In one embodiment, the first dielectric layer 109 is formed over a metal feature (such as the metal features 122a and 122b of FIG. 1) of a metallization layer of an interconnect structure. As such, the first bottom electrode via 121a and the second bottom electrode via 121b are both electrically connected to the metal features.

At operation 304, a hard mask structure is formed and partially disposed on the first bottom electrode via and the second bottom electrode via. In the illustrated example of FIG. 4A, a hard mask layer is formed and disposed on the stop layer 122. The hard mask layer is patterned and etched to form the hard mask structure 106 that protrudes upwardly from the stop layer 122. The hard mask structure 106 has a bottom surface 132 that is partially coupled to both the first bottom electrode via 121a and the second bottom electrode via 121b, respectively. In some embodiments, the hard mask structure 106 includes silicon oxide, although other materials such as silicon nitride can also be included in the hard mask structure 106 in alternative embodiments.

At operation 306, a bottom electrode layer is deposited. In the illustrated example of FIG. 4B, a bottom electrode layer 402 is deposited on the stop layer 122. The bottom electrode layer 402 completely encloses the hard mask structure 106. Particularly, the bottom electrode layer 402 includes a first side wall portion 402a that covers the first side wall 133a of the hard mask structure 106. Similarly, the bottom electrode layer 402 also includes a second side wall portion 402b that covers the second side wall 133b of the hard mask structure 106.

In some implementations, the bottom electrode layer 402 is deposited using a deposition process such as PVD. In some embodiments, the bottom electrode layer 402 includes a conductive material such as metal, metal alloy, or metal nitride. In some embodiments, the bottom electrode layer 402 includes a metal such as titanium (Ti), aluminum (Al), tantalum (Ta), copper (Cu), tungsten (W), or any combination thereof. In other embodiments, the bottom electrode layer 402 includes titanium nitride (TiN). The TiN can be formed by depositing Ti using PVD in the presence of nitrogen ($N_2$). A ratio of Ti/N of the TiN may be controlled to achieve an optimal conductivity of the bottom electrode layer 402 by adjusting the operating conditions of the PVD.

At operation 308, a self-etching process (sometimes also referred to as a "blanket etching process") is performed to etch the bottom electrode layer to form a first bottom electrode and a second bottom electrode. In some implementations, the self-etching process is a dry etching process using a gaseous entrant.

As shown in the example of FIG. 4C, the bottom electrode layer 402 in a corner region between the hard mask structure 106 and the first bottom electrode via 121a is not completely removed, due to the anisotropic nature of the self-etching process. Accordingly, at least a part of the first side wall portion 402a of the bottom electrode layer 402 remains on the first side wall 133a of the hard mask structure 106 and forms a tapered shape after the self-etching process. The remained part of the first side wall portion 402a forms the first bottom electrode 104a. Similarly, at least a part of the second side wall portion 402b of the bottom electrode layer 402 remains on the second side wall 133b of the hard mask structure 106 and forms a tapered shape after the self-etching process. The remained part of the second side wall portion 402b forms the second bottom electrode 104b.

At operation 310, a switching layer is deposited. The switching layer is deposited using suitable techniques such as ALD and PVD. The switching layer may be made of various oxidation materials such as zirconium dioxide ($ZrO_2$), tantalum oxide (TaO), titanium dioxide ($TiO_2$), hafnium oxide ($HfO_2$), aluminum oxide ($Al_2O_3$), copper oxide (CuO), zinc oxide (ZnO), tungsten trioxide ($WO_3$), and the like. In the illustrated example of FIG. 4D, the switching layer 141 is deposited on the stop layer 122. The switching layer completely encloses the first RRAM device 103a, the second RRAM device 103b, and the hard mask structure 106.

At operation 312, a CMP process is performed. The CMP process is performed on the switching layer to achieve a relatively flat top surface of the switching layer with, for example, a pre-determined thickness.

At operation 314, a second dielectric layer is deposited on the switching layer. Similar to the first dielectric layer, the second dielectric layer may include silicon oxide, undoped silicate glass (USG), silicon nitride (SiN), silicon carbide (SiC), or a similar composite dielectric film. In some embodiments, the second dielectric layer may be formed by a deposition technique (e.g., PVD, CVD, PECVD, ALD, sputtering, etc.) to a predetermined thickness range. In the illustrated example of FIG. 4E, the second dielectric layer 110 is deposited on the switching layer 141.

At operation 316, the second dielectric layer is selectively etched to form an opening in the second dielectric layer. The opening is vertically aligned with the hard mask structure, and a portion of the switching layer is exposed to the opening. In one implementation, the opening is formed by etching areas of the second dielectric layer that are left exposed by a photoresist mask. In other implementations, the opening is formed by etching areas of the second dielectric layer that are left exposed by a hard mask such as a nitride hard mask. In some implementations, the second dielectric layer is selectively etched by wet etching. In other implementations, the second dielectric layer is selectively etched by dry etching. As shown in the example of FIG. 4E, an opening is formed in the second dielectric layer 110, and the opening is vertically aligned with the hard mask structure 106.

At operation 318, a top electrode layer is deposited on the second dielectric layer. In one implementation, the bottom electrode layer is deposited using PVD. The top electrode layer fills in the opening formed in the second dielectric layer. In one embodiment, the bottom electrode layer includes a metal such as Ti, Ta, Al, Cu, and W. In another embodiment, the bottom electrode layer is made of a metal alloy such as an AlCu alloy. As shown in the example of FIG. 4E, a top electrode layer is deposited on the second dielectric layer 110, and a portion of the top electrode layer fills the opening formed in the second dielectric layer 110.

At operation 320, a CMP process is performed. The CMP process is performed on the top electrode layer until the second dielectric layer is also polished out (i.e., exposed). The CMP process removes the portion of the top electrode layer that is outside the opening. As shown in the example of FIG. 4E, the top electrode layer that is outside the opening is removed, thus forming the top electrode 105.

Figure 5:
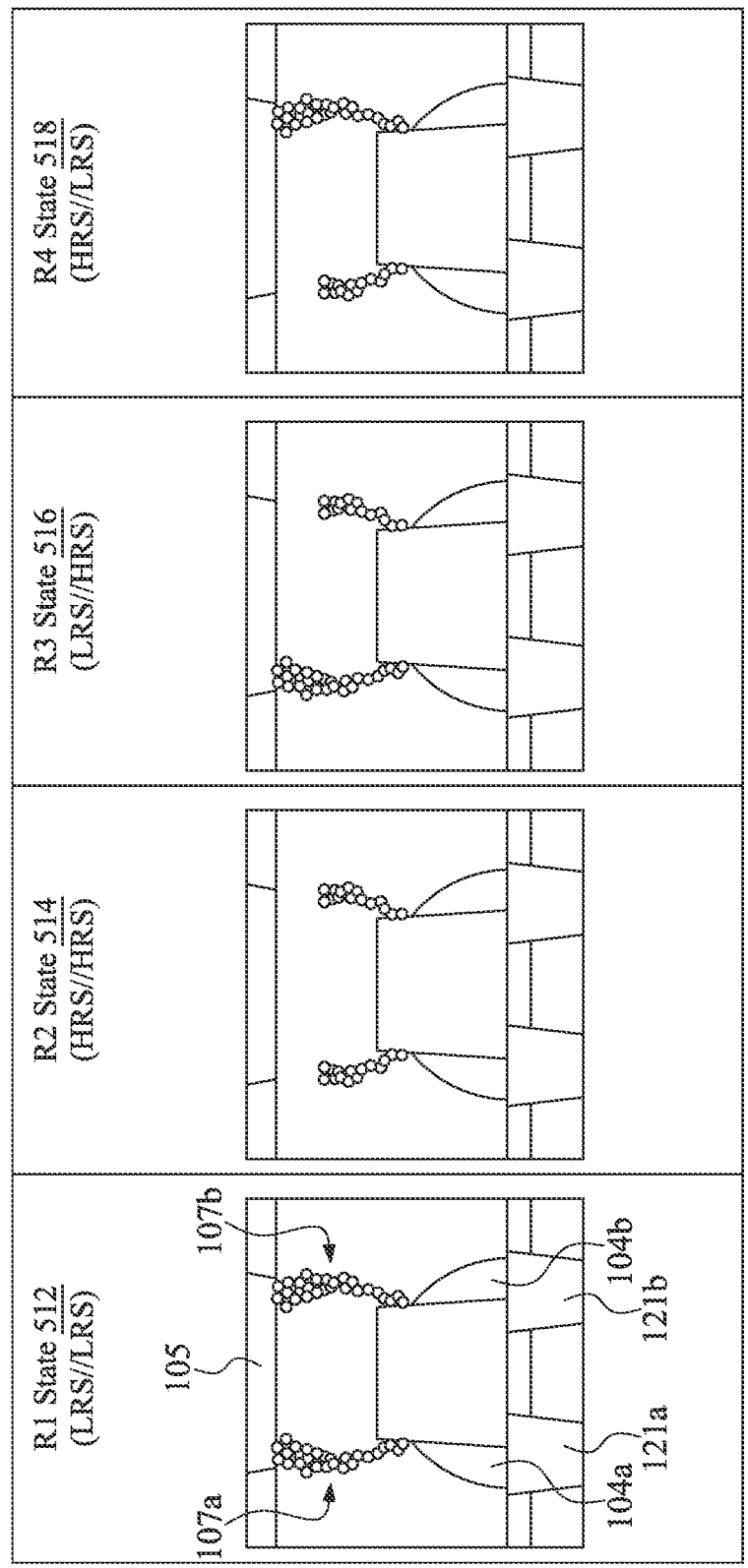
FIG. 5 is a schematic diagram illustrating multiple resistance states of an example RRAM device in accordance with some embodiments.

FIG. 5 is a diagram illustrating multiple resistance states of an example RRAM device in accordance with some embodiments. In the illustrated example shown in FIG. 5, the RRAM device 103 includes the first RRAM device 103a and the second RRAM device 103b, which share the top electrode 105. In the R1 state 512, both the first RRAM device 103a and the second RRAM device 103b have a low resistance state (LRS). The overall resistance is equivalent to a low resistance state in parallel with another low resistance state (denoted as "LRS//LRS"). In the R2 state 514, both the first RRAM device 103a and the second RRAM device 103b have a high resistance state (HRS). The overall resistance is equivalent to a high resistance state in parallel with another high resistance state (denoted as "HRS//HRS"). In the R3 state 516, the first RRAM device 103a has a low resistance state (LRS) while the second RRAM device 103b has a high resistance state (HRS). The overall resistance is equivalent to a low resistance state in parallel with a high resistance state (denoted as "LRS//HRS"). In the R4 state 518, the first RRAM device 103a has a high resistance state (HRS) while the second RRAM device 103b has a low resistance state (LRS). The overall resistance is equivalent to a high resistance state in parallel with a low resistance state (denoted as "HRS//LRS").

Figure 6A:
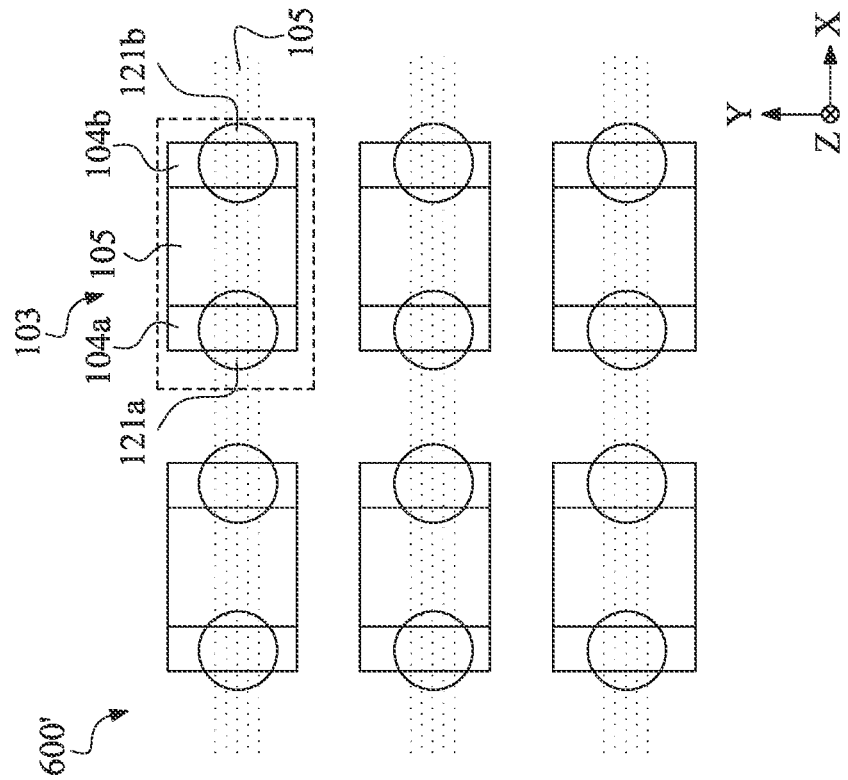
FIGS. 6A-6B are schematic diagrams illustrating an example layout of an array of RRAM devices in accordance with some embodiments.

FIGS. 6A-7 are schematic diagrams illustrating an example layout of an array of RRAM devices in accordance with some embodiments. In the illustrated example of FIG. 6A, a layout 600 includes an array of RRAM devices 103 arranged in rows and columns. The multiple RRAM devices 103 in each row share the top electrode 105. The multiple RRAM devices 103 in each column share the first bottom electrode 104a, the second bottom electrode 104b, and the hard mask structure 106. During fabrication of the RRAM devices 103, the hard mask structure 106 may be simultaneously formed for the entire column. Accordingly, the first bottom electrode 104a and the second bottom electrode 104b may also be simultaneously formed for the entire column.

Figure 6B:
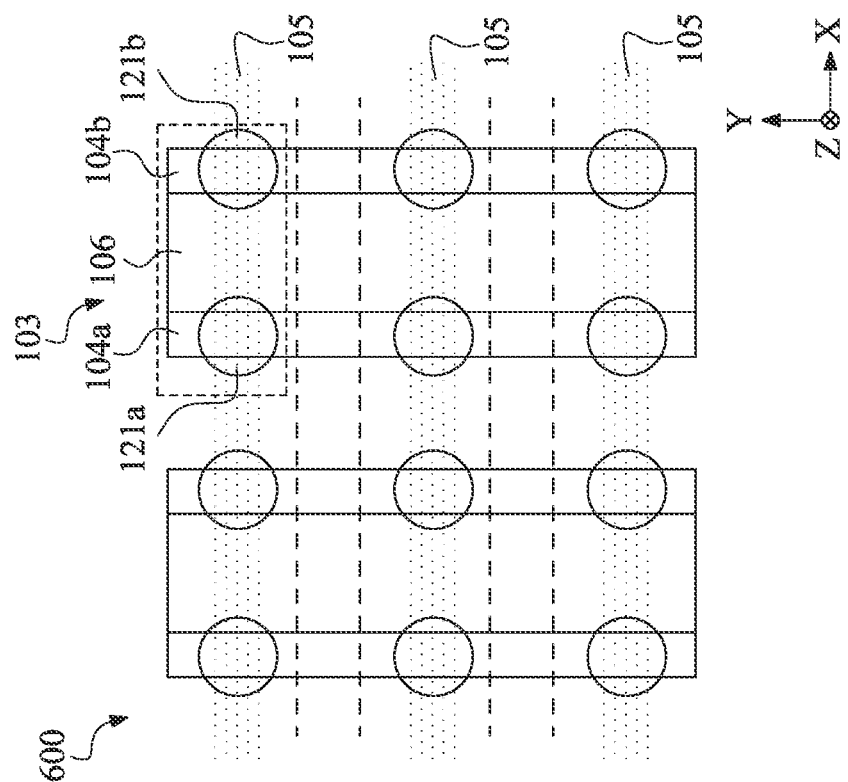

In the example shown in FIG. 6B, the first bottom electrode 104a, the second bottom electrode 104b, and the hard mask structure 106 shared in each column, as shown in FIG. 6A, are subsequently separated. In one implementation, the first bottom electrode 104a, the second bottom electrode 104b, and the hard mask structure 106 shared in each column are separated by, for example, an X-direction etching process (sometimes also referred to as "X-cut"). As a result, the multiple RRAM devices 103 in the layout 600' operate independently. Therefore, the overall fabrication efficiency can be improved.

In the illustrated example of FIG. 7, a layout 700 of an array of RRAM devices 103 are arranged in rows and columns. In some embodiments, the array of RRAM devices 103 has 5 RRAM devices 103 in a row and 10 RRAM devices 103 in a column (i.e., an array of 5×10 devices). Because each RRAM device 103 has two isolated bottom electrode vias 121a and 121b, the array of 5×10 devices can be considered as an array of 10×10 vias. Each of the array of RRAM devices 103 works independently. It should be noted that the number of RRAM devices 103 in each row and each column may vary depending on the design requirement.

Example RRAM Devices with a Tapered Bottom Electrode

Figure 8:
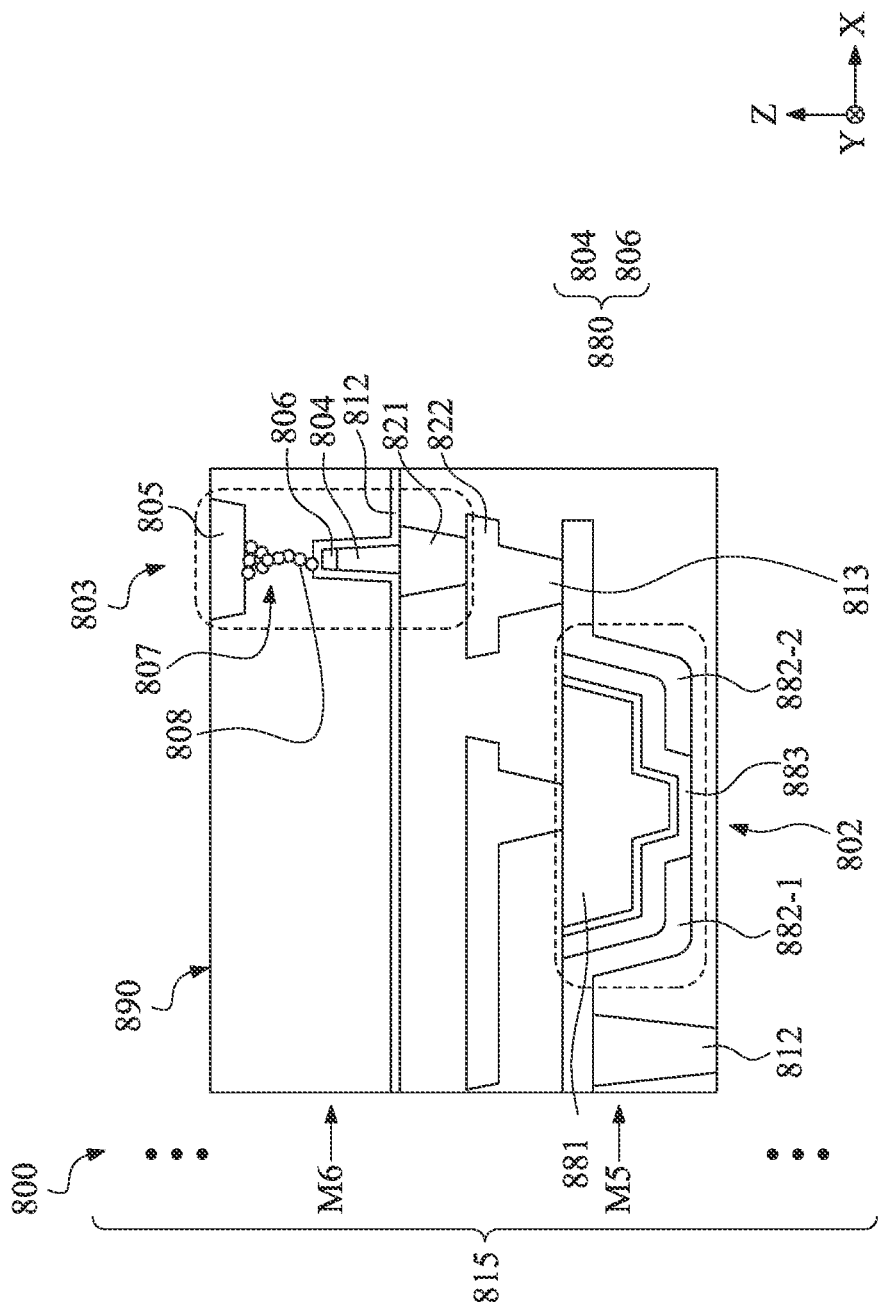
FIG. 8 is a schematic diagram illustrating a cross-sectional view of an example integrated circuit device including an RRAM device in accordance with some embodiments.

FIG. 8 is a schematic diagram illustrating a cross-sectional view of an example integrated circuit device 800 including an RRAM device 803 in accordance with some embodiments. In the illustrated example, the integrated circuit device 800 includes an RRAM cell 890, which includes the RRAM device 803 and a thin-film transistor (TFT) 802. In other embodiments, an integrated circuit device includes multiple RRAM cells 890 arranged in rows and columns. The TFT 802 has a similar structure to the TFT 102a of the RRAM device 103 shown in FIG. 1.

The RRAM device 803 includes a bottom electrode 880 in a tapered shape instead of a conventional top electrode to address the aforementioned challenges resulted from the filament variations. In some embodiments, the bottom electrode 880 has a needle-like shape. It should be noted that a needle-like shape is one example of a tapered shape, though the terms "needle-like-shape" and "tapered shape" may be used interchangeably in the disclosure. The RRAM device 803 also includes a top electrode 805 vertically aligned with and opposed to the tapered bottom electrode 880, a switching layer 841 between the top electrode 805 and the bottom electrode 880, and a bottom electrode via 821 electrically connected to the bottom electrode 880. In some embodiments, the RRAM device 803 optionally includes an oxygen-rich dielectric layer 812 disposed on and enclosing the tapered bottom electrode 880. As explained above, the electrical resistance of the switching layer 841 can be changed between a high resistance state (HRS) and a low resistance state (LRS). Details of the structure of the RRAM device 803 will be described below with reference to FIG. 9, whereas details of the fabrication of the RRAM device 803 will be described below with reference to FIGS. 10-11J.

In the illustrated example, the integrated circuit device 800 includes an interconnect structure 815 formed over a substrate. The interconnect structure 815 includes multiple inter-level dielectric (ILD) layers interleaved with metallization layers. The metallization layers are commonly identified as the M1 metallization layer, the M2 metallization layer, the M3 metallization layer, the M4 metallization layer, the M5 metallization layer, the M6 metallization layer, and so on. Each metallization layer may include multiple metal features. For example, the M6 metallization layer has a metal feature 822, as shown in FIG. 8.

In the example shown in FIG. 8, the RRAM device 803 is disposed and fabricated in the M6 metallization layer; the TFT 802 is disposed and fabricated in the M5 metallization layers. It should be understood that this is exemplary rather than limiting, and one of ordinary skill in the art would recognize many variations, modifications, and alternatives. In some embodiments, the TFT 802 is disposed and fabricated in an adjacent (i.e., either immediately above or immediately below) metallization layer of the metallization layer where the RRAM device 803 is disposed.

In the illustrated example of FIG. 8, the TFT 802 is used as an access transistor. As mentioned above, the TFT 802 has a similar structure to the TFT 102*a* shown in FIG. 1. It should be noted that the TFT 802 is only one example of the access transistors, and other types of transistors (e.g., Fin-FETs) are within the scope of the disclosure. As shown in FIG. 8, the TFT 802 includes, among other things, a gate 881, a first source/drain (S/D) region 882-1, a second S/D region 882-2, and a channel 883. A contact 813 connects the second S/D region 882-2 of the TFT 802 to the metal feature 822. As such, the TFT 802 is electrically connected to the bottom electrode 880 of the RRAM device 803, through the contact 813, the metal feature 822, and the bottom electrode via 821.

Figure 9:
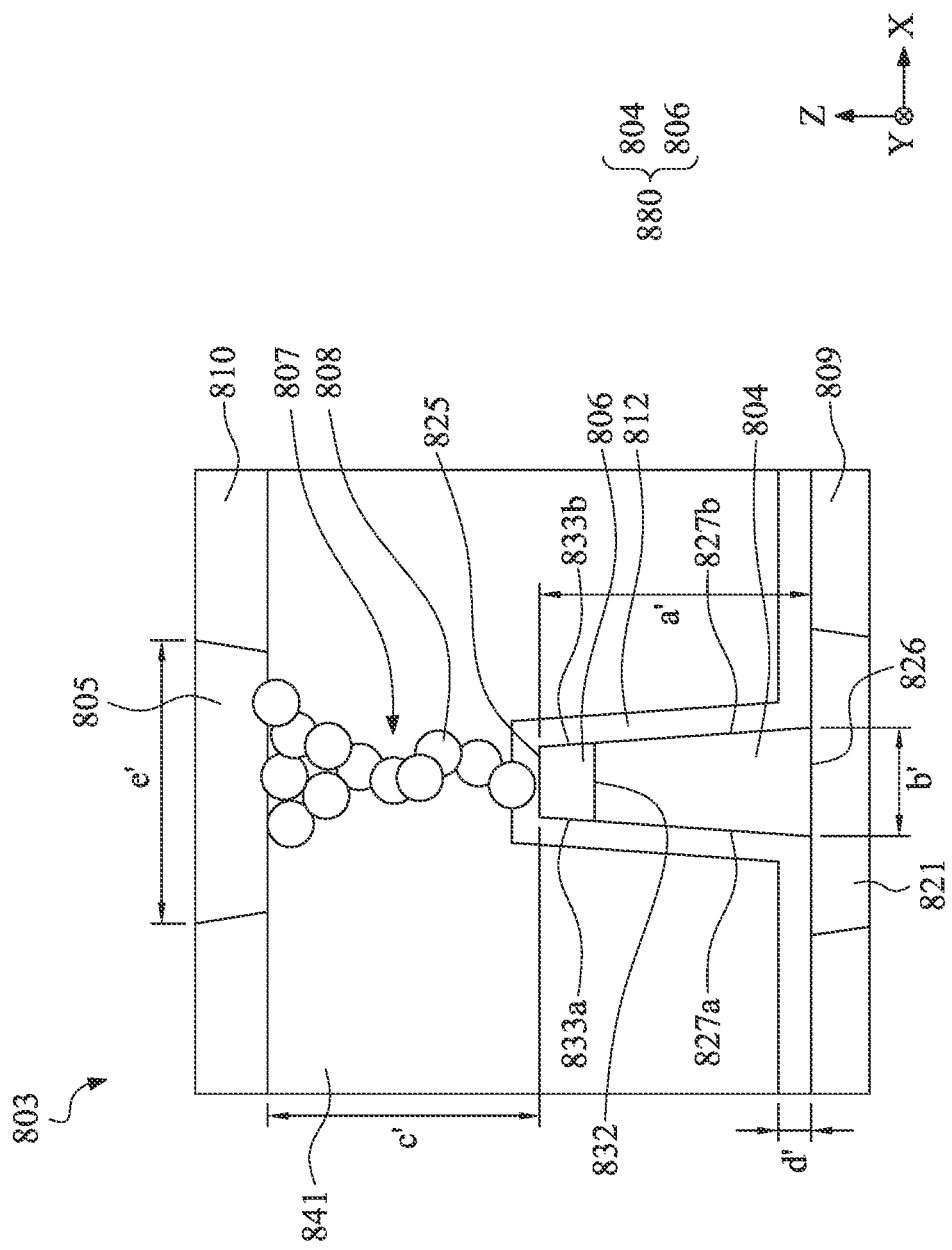
FIG. 9 is a schematic diagram illustrating the example RRAM device shown in FIG. 8 in accordance with some embodiments.

FIG. 9 is a schematic diagram illustrating the example RRAM device 803 shown in FIG. 8 in accordance with some embodiments. In the illustrated example, as mentioned above, the RRAM device 803 includes, among other things, the top electrode 805, the switching layer 841, the bottom electrode 880, the bottom electrode via 821, and optionally the oxygen-rich dielectric layer 812.

In the example shown in FIG. 9, the bottom electrode via 821 is disposed in a first dielectric layer 809. The bottom electrode 880 is disposed on and electrically connected to the bottom electrode via 821. As mentioned above, the bottom electrode 880 extends upwardly from a bottom surface 826 to a top surface 825 in the vertical direction (i.e., the Z-direction shown in FIG. 9). As such, the bottom electrode 880 protrudes upwardly from the bottom electrode via 821 and points towards the top electrode 805. The bottom electrode 880 has a first side wall 827*a* and a second side wall 827*b*. Each of the first side wall 827*a* and the second side wall 827*b* connects the top surface 825 and the bottom surface 826, respectively. The bottom surface 826 is in contact with the bottom electrode via 821.

In the example shown in FIG. 9, the bottom electrode 880 has a base portion 804, a tip portion 806, and an interface 832 connecting the base portion 804 and the tip portion 806. The interface 832 is between the top surface 825 and the bottom surface 826. The base portion 804 extends vertically from bottom surface 826 to the interface 832, and the tip portion 806 extends vertically from the interface 832 to the top surface 825.

In the example shown in FIG. 9, the bottom electrode 880 has a tapered shape. The bottom electrode 880 has a horizontal dimension (i.e., in the X-Y plane shown in FIG. 9) gradually decreasing upwardly in the vertical direction (i.e., the Z-direction shown in FIG. 9) from the bottom surface 826 to the top surface 825. In other words, the tip portion 806 has a relatively smaller horizontal dimension as compared to the base portion 804. In some embodiments, the bottom electrode 880 has a needle-like shape, and the tip portion 806 has a large curvature and a sharp peak.

In some embodiments, the RRAM device 803 has the oxygen-rich dielectric layer 812 disposed on the first dielectric layer 809 and completely encloses the bottom electrode 880. As such, the oxygen-rich dielectric layer 812 in contact with the top surface 825, the first side wall 827*a*, and the second side wall 827*b*, respectively. The switching layer 841 is disposed on the oxygen-rich dielectric layer 812. A second dielectric layer 810 is disposed on the switching layer 841. The top electrode 805 is disposed in the second dielectric layer 810. The top electrode 805 extends downwardly through an entire thickness of the top electrode 805 in the vertical direction and is in contact with the switching layer 841. The top electrode 805 is aligned with and distanced above the bottom electrode 880 in the vertical direction.

Due to the tapered shape of the bottom electrode 880, a point discharge occurs when a filament 807 is formed by applying a forming voltage ($V_{forming}$) to the bottom electrode 880. In the illustrated example shown in FIG. 9, the filament 807 corresponds to the remaining oxygen vacancies 808. Since the tip portion 806 has a large curvature, the electrical field around the tip portion 806 is larger than that of a conventional top electrode, given the same voltage. As a result, it becomes easier to break down the switching layer 841 to form the filament 807. In other words, it becomes easier to form the filament 807 between the tip portion 806 and the top electrode 805 than between a conventional electrode, which is a flat electrode, and the top electrode 805. Accordingly, the formation of the filament 807 is more predictable and controllable. As a result, the endurance and data retention in the RRAM device 803 is improved significantly.

On the other hand, the oxygen-rich dielectric layer 812 is a layer with a relatively high concentration of oxygen ions. In one embodiment, the oxygen-rich dielectric layer 812 has a concentration of oxygen ions higher than a threshold concentration. In one embodiment, the oxygen-rich dielectric layer 812 has a concentration of oxygen ions higher than that of the switching layer 841, if the oxygen-rich dielectric layer 812 and the switching layer 841 are made of the same material. As such, the oxygen-rich dielectric layer 812 can have enough oxygen ions to compensate for the loss of oxygen ions after frequent switching operations. The high concentration of oxygen ions makes the oxygen-rich dielectric layer 812 a good compensation source for the loss of oxygen ions after frequent switching operations. Accordingly, the endurance and the data retention of the RRAM device 803 are improved significantly.

As shown in FIG. 9, the bottom electrode 880 has a height a', measured from the top surface 825 to the bottom surface 826 in the vertical direction (i.e., the Z-direction shown in FIG. 9); the bottom electrode 880 has a width b' in the horizontal direction (i.e., the X-direction shown in FIG. 9); a distance c' is between the top surface 825 of the bottom electrode 880 and the top electrode 805 in the vertical direction (i.e., the Z-direction shown in FIG. 9); the oxygen-rich dielectric layer 812 has a thickness d; the top electrode 805 has a width e' in the horizontal direction (i.e., the X-direction shown in FIG. 9). In one embodiment, a' is at least 1 nm. In one embodiment, b' is at least 0.5 nm. In one embodiment, c' is at least 2 nm. In one embodiment, d' is at least 0.5 nm. In one embodiment, e' is at least 2 nm. In one embodiment, a ratio of e' to b' (denoted as "e'/b'") is at least 4.

Figure 10:
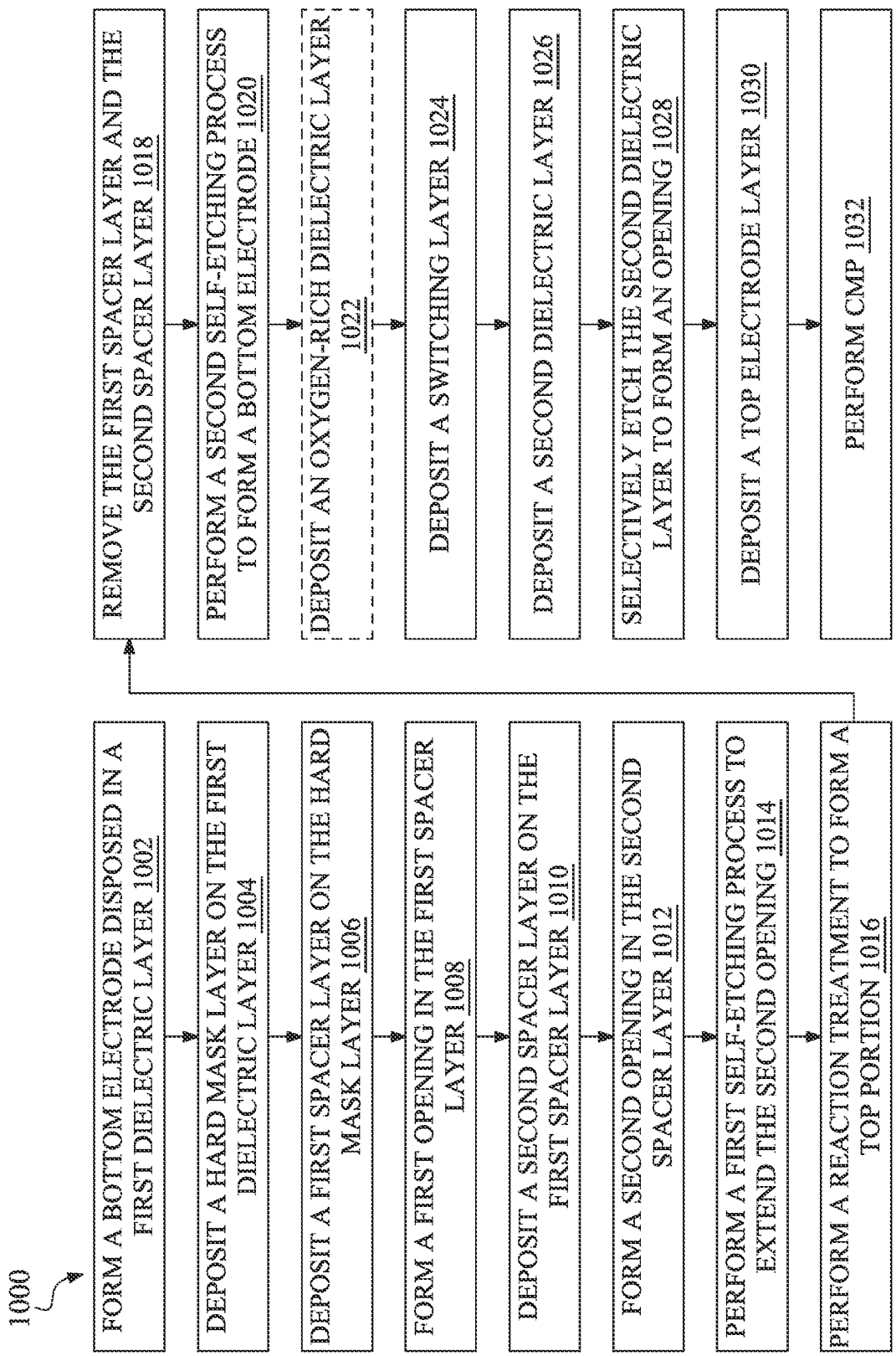
FIG. 10 is a flowchart diagram illustrating an example method of fabricating an RRAM device in accordance with some embodiments.

FIG. 10 is a flowchart diagram illustrating an example method 1000 of fabricating an RRAM device in accordance with some embodiments. FIGS. 11A-11J are schematic diagrams illustrating cross-sectional views of an RRAM device 1100 at various fabrication stages in accordance with some embodiments. In some embodiments, the RRAM device 1100 may be included in a microprocessor, memory cell, and/or other integrated circuits. Also, FIGS. 11A-11J are simplified for a better understanding of the concepts of the present disclosure. For example, although FIGS. 11A-11J illustrate the RRAM device 1100, it is understood the integrated circuit, in which the RRAM device 1100 is formed, may include a number of other devices including resistors, capacitors, inductors, fuses, and the like, which are not shown in FIGS. 11A-11J, for purposes of clarity of illustration.

In the illustrated example of FIG. 10, the method 1000 includes operations 1002, 1004, 1006, 1008, 1010, 1012, 1014, 1016, 1018, 1020, 1024, 1026, 1028, and 1030. In some embodiments, the method 1000 includes an optional operation 1022. Additional operations may be performed. Also, it should be understood that the sequence of the various operations discussed above with reference to FIG. 10 is provided for illustrative purposes, and as such, other embodiments may utilize different sequences. These various sequences of operations are to be included within the scope of embodiments.

The method 1000 starts at operation 1002. At operation 1002, a bottom electrode via is formed in a first dielectric layer. In some embodiments, an opening is formed in the first dielectric layer (e.g., the first dielectric layer 809 shown in FIG. 11A). A metal layer is formed on the first dielectric layer and fill in the opening. A chemical-mechanical planarization (CMP) process is performed on the metal layer until the first dielectric layer is polished out (i.e., exposed). As such, the bottom electrode via (e.g., the bottom electrode via 821 shown in FIG. 10A) is formed in the opening. In some embodiments, the bottom electrode via includes a metal such as Cu, Al, or AlCu alloy.

In some implementations, the first dielectric layer is formed by a deposition technique (e.g., PVD, CVD, PECVD, ALD, sputtering, etc.) to a predetermined thickness range. In some implementations, the opening in the first dielectric layer is formed by a selective etching process (i.e., a patterning and etching process) using a mask. In one embodiment, the first dielectric layer is formed over a metal feature (e.g., the metal feature 822 of FIG. 8) of a metallization layer of an interconnect structure. As such, the bottom electrode via is electrically connected to the metal feature.

At operation 1004, a hard mask layer is deposited on the first dielectric layer. In the illustrated example of FIG. 11A, a hard mask layer 1102 is formed and disposed on the first dielectric layer 809. The hard mask layer 1102 is in contact with a top surface of the bottom electrode via 821. In some embodiments, the hard mask layer 1102 includes a metal, a metal nitride or a combination thereof. In one embodiment, the hard mask layer 1102 includes Ti. In one embodiment, the hard mask layer 1102 includes TiN. The TiN can be formed by depositing Ti using PVD in the presence of nitrogen ($N_2$). A ratio of TiN of the TiN may be controlled to achieve an optimal conductivity of the bottom electrode 880 formed in subsequent operations as described below, by adjusting the operating conditions of the PVD.

At operation 1006, a first spacer layer is deposited on the hard mask layer. In some implementations, the first spacer layer is deposited using a deposition technique (e.g., PVD, CVD, PECVD, ALD, sputtering, etc.) to a predetermined thickness range. In some embodiments, the first spacer layer includes silicon oxide, although other materials may also be possible in alternative embodiments. In the illustrated example of FIG. 11B, the first spacer layer 1104 is formed.

At operation 1008, a first opening is formed in the first spacer layer. In some implementations, the first opening in the first spacer layer is formed by a selective etching process (i.e., a patterning and etching process) using a mask. In the illustrated example of FIG. 11B, the first opening 1106 is formed in the first spacer layer 1104. The first opening 1106 is aligned or substantially aligned with the bottom electrode via 821 in the vertical direction. The first opening 1106 extends vertically through an entire thickness of the first spacer layer 1104, such that the top surface 825 of the hard mask layer 1102 is exposed to the first opening 1106.

At operation 1010, a second spacer layer is deposited on the first spacer layer. In some implementations, the second spacer layer is deposited to a predetermined thickness range using the similar deposition technique to the first spacer layer. The second spacer layer may include a similar material to the first spacer layer. In the illustrated example of FIG. 11C, the second spacer layer 1108 is deposited on the first spacer layer 1104 and fills in the first opening 1106. As such, the second spacer layer 1108 completely covers the top surface 825 of the hard mask layer 1102.

At operation 1012, a second opening is formed in the second spacer layer. In some implementations, the second opening in the second spacer layer is formed using a similar etching process to the first spacer layer. In the illustrated example of FIG. 11C, the second opening 1110 is formed in the second spacer layer 1108 within the horizontal dimension of the first opening 1106. The second opening 1110 is also aligned or substantially aligned with the bottom electrode via 821 in the vertical direction. The second opening 1110 extends downwardly from a top open end 1111 to a bottom end 1113 in the vertical direction. The bottom end 1113 of the second opening 1110 is distanced above the top surface 825 of the hard mask layer 1102. In other words, the second opening 1110 is not extending through an entire thickness of the second spacer layer 1108 filled in the first opening 1106, such that the top surface 825 of the hard mask layer 1102 is not exposed to the bottom end 1113 of the second opening 1110. Compared with the first opening 1106, the second opening 1110 has a relatively smaller horizontal dimension.

At operation 1014, a first self-etching process (sometimes also referred to as a "blanket etching process") is performed to extend the second opening. In some implementations, the first self-etching process is a dry etching process using a gaseous entrant. In some embodiments, the gaseous entrant includes octafluorocyclobutane (CIF's), tetrafluoromethane ($CF_4$), trifluoromethane ($CHF_3$), or any combination thereof. In some implementations, the first self-etching process is a reactive ion etching (RIE) process. In the illustrated example of FIG. 11D, the first self-etching process is performed to extend the second opening 1110 in the vertical direction until the bottom end 1113 reaches the top surface 825 of the hard mask layer 1102, such that the top surface 825 is exposed to the second opening 1110. The top open end 1111 of the second opening 1110 may also be extended horizontally in the first self-etching process.

At operation 1016, a reaction treatment is performed to form a top portion of a bottom electrode. In the illustrated example of FIG. 11D, the reaction treatment is performed to convert a portion of the hard mask layer 1102 under the exposed top surface 825 into a tip portion 806. In some implementations, a reactive agent is used to react with the material of the hard mask layer 1102 and generate a product of reaction treatment in the tip portion 806. The reaction treatment can be controlled to proceed from the top surface 825 to an interface 832 below the top surface 825 in the vertical direction. As such, the vertical dimension of the top portion, as measured between the top surface 825 and the interface 832, can be controlled. As mentioned above, the horizontal dimension of the tip portion 806 is substantially the same as the horizontal dimension of the bottom end 1113 of the second opening 1110.

The tip portion 806 includes the product of the reaction treatment, which has a higher boiling point and is chemically more stable, as compared with the material of the hard mask layer 1102. In some embodiments, the hard mask layer 1102 has a first boiling point, and the tip portion 806 has a second boiling point. The second boiling point is higher than the first boiling point. In some embodiments, the second boiling point is at least about 180 degrees Celsius. In some embodiments, the second boiling point is at least about 200 degrees Celsius. The relatively high boiling point and the high chemical stability of the tip portion 806 enables the tip portion 806 to withstand a subsequent self-etching process, which is typically a plasma etching process. Accordingly, the tip portion 806 can be considered as a hard-to-remove mask for the subsequent self-etching process.

The product of the reaction treatment included in the tip portion 806 depends on the material of the hard mask layer 1102 and the reactive agent used in the reaction treatment. As mentioned above, the material of the hard mask layer 1102 may include a metal such as titanium (Ti), copper (Cu), tungsten (W), aluminum (Al), indium (In), and gallium (Ga). The reactive agent may include a halogen-containing molecule such as $CF_4$ or chlorine ($Cl_2$). In one example, the hard mask layer 1102 includes TiN, and the reactive agent includes $CF_4$. Accordingly, the tip portion 806 includes the titanium tetrafluoride ($TF_4$), which is the reaction product of TiN and $CF_4$. It is noted that the example describe above is not intended to be limiting, and other materials having a high boiling point may also be included in the tip portion 806.

In some embodiments, the tip portion 806 includes a metal halide, a metal oxyhalide, or a combination thereof. Non-limiting examples of the metal halide and the metal oxyhalide include aluminum fluoride ($AlF_3$), copper (I) fluoride (CuF), tungsten (VI) oxytetrafluoride ($WOF_4$), gallium (III) trifluoride ($GaF_3$), indium (III) fluoride ($InF_3$), copper (I) chloride (CuCl), tungsten (VI) oxytetrachloride ($WOCl_4$), aluminum chloride ($AlCl_3$), gallium (III) trichloride ($GaCl_3$), indium (III) chloride ($InCl_3$), or any combination thereof.

At operation 1018, the first spacer layer and the second spacer layer are removed. In some embodiments, an etching process is used to remove the first spacer layer and the second spacer layer and expose the hard mask layer. In one implementation, the etching process is a wet etching process using hydrogen fluoride (HF). In another implementation, the etching process is a dry etching process. In the illustrated example of FIG. 11F, the etching process is performed to completely remove the first spacer layer 1104 and the second spacer layer 1108, such that the hard mask layer 1102 and the top surface 825 of the tip portion 806 are exposed.

At operation 1020, a second self-etching process is performed to form a bottom electrode. In some implementations, the second self-etching process is a dry etching process using a gaseous entrant. In some embodiments, the gaseous entrant includes chlorine ($Cl_2$), octafluorocyclobutane ($C_4F_8$), tetrafluoromethane ($CF_4$), trifluoromethane ($CHF_3$), or any combination thereof. In some implementations, the second self-etching process is a reactive ion etching (RIE) process.

In the illustrated example of FIG. 11G, the second self-etching process is performed to etch the hard mask layer 1102. As mentioned above, the tip portion 806 serves as a hard-to-remove mask that withstands the second self-etching process, due to the high boiling point and high chemical stability of the tip portion 806. Thus, the base portion 804 below the tip portion 806 could remain after the second self-etching process. The rest of the hard mask layer 1102 surrounding the bottom electrode 880 is completely removed, such that the first dielectric layer 809 is exposed. Accordingly, the bottom electrode 880 including the base portion 804 and the tip portion 806 is formed and protrudes from the first dielectric layer 809. It is noted that the bottom electrode 880 may have a tapered shape due to the anisotropic nature of the second self-etching process.

In some embodiments, at operation 1022, an oxygen-rich dielectric layer is deposited. In some implementations, the oxygen-rich dielectric layer is deposited using PEPVD in the presence of $O_2$. In some implementations, the oxygen-rich dielectric layer is deposited using CVD. In other implementations, the oxygen-rich dielectric layer is deposited using ALD. The oxygen-rich dielectric layer may be made of various oxidation materials such as zirconium dioxide ($ZrO_2$), tantalum oxide (TaO), titanium dioxide ($TiO_2$), hafnium oxide ($HfO_2$), aluminum oxide ($Al_2O_3$), copper oxide (CuO), zinc oxide (ZnO), tungsten trioxide ($WO_3$), and the like. In the illustrated example of FIG. 11H, the oxygen-rich dielectric layer 812 is deposited on the first dielectric layer 809 and completely encloses the bottom electrode 880.

At operation 1024, a switching layer is deposited. The switching layer is deposited using suitable techniques such as CVD, ALD, and PVD. The switching layer may be made of various oxidation materials such as zirconium dioxide ($ZrO_2$), tantalum oxide (TaO), titanium dioxide ($TiO_2$), hafnium oxide ($HfO_2$), aluminum oxide ($Al_2O_3$), copper oxide (CuO), zinc oxide (ZnO), tungsten trioxide ($WO_3$), and the like. In some embodiments, the oxygen-rich dielectric layer has a higher oxygen concentration compared with the switching layer. In the illustrated example of FIG. 11I, the switching layer 841 is deposited on the oxygen-rich dielectric layer 812. In some embodiments, no oxygen-rich dielectric layer is deposited, and the switching layer 841 can be deposited directly on the first dielectric layer 809 and completely encloses the bottom electrode 880.

At operation 1026, a second dielectric layer is deposited on the switching layer. Similar to the first dielectric layer, the second dielectric layer may include silicon oxide, undoped silicate glass (USG), silicon nitride (SiN), silicon carbide (SiC), or a similar composite dielectric film. In some embodiments, the second dielectric layer may be formed by a deposition technique (e.g., PVD, CVD, PECVD, ALD, sputtering, etc.) to a predetermined thickness range. As shown in the example of FIG. 11J, the second dielectric layer 810 is formed on the switching layer 841.

At operation 1028, the second dielectric layer is selectively etched to form an opening in the second dielectric layer. The opening is vertically aligned with the bottom electrode, and a portion of the switching layer is exposed to the opening. In one implementation, the opening is formed by etching areas of the second dielectric layer that are left exposed by a photoresist mask. In other implementations, the opening is formed by etching areas of the second dielectric layer that are left exposed by a hard mask such as a nitride hard mask. In some implementations, the second dielectric layer is selectively etched by wet etching. In other implementations, the second dielectric layer is selectively etched by dry etching. As shown in the example of FIG. 11J, an opening is formed in the second dielectric layer 810, and the opening is vertically aligned with the bottom electrode 880.

At operation 1030, a top electrode layer is deposited on the second dielectric layer. In one implementation, the bottom electrode layer is deposited using PVD. The top electrode layer fills in the opening formed in the second dielectric layer. In one embodiment, the bottom electrode layer includes a metal such as Ti, Ta, Al, Cu, and W. In another embodiment, the bottom electrode layer is made of a metal alloy such as an AlCu alloy. As shown in the example of FIG. 11J, a top electrode layer is deposited on the second dielectric layer 810, and a portion of the top electrode layer fills the opening formed in the second dielectric layer 810.

At operation 1032, a CMP process is performed. The CMP process is performed on the top electrode layer until the second dielectric layer is also polished out (i.e., exposed). The CMP process removes the portion of the top electrode layer that is outside the opening. As shown in the example of FIG. 11J, the portion of the top electrode layer that is outside the opening is removed, thus forming the top electrode 805 in the top dielectric layer 810.

Example TFT Fabrication Process

In the semiconductor industry, there is a constant desire to increase the areal density of integrated circuits. To do so, individual transistors have become increasingly smaller. However, the rate at which individual transistors may be made smaller is slowing. Moving a portion of transistors (e.g., peripheral transistors) from the front-end-of-line (FEOL) to the back-end-of Line (BEOL) of fabrication may be advantageous because functionality may be added at the BEOL while valuable chip area may be made available in the FEOL. Thin-film transistors (TFTs) made of oxide semiconductors are an attractive option for BEOL integration since TFTs may be processed at low temperatures (e.g., lower than 450° C.) and thus, will not damage previously fabricated devices. A TFT is a special type of field-effect transistor (FET) where the transistor is thin relative to the plane of the device.

Figure 12:
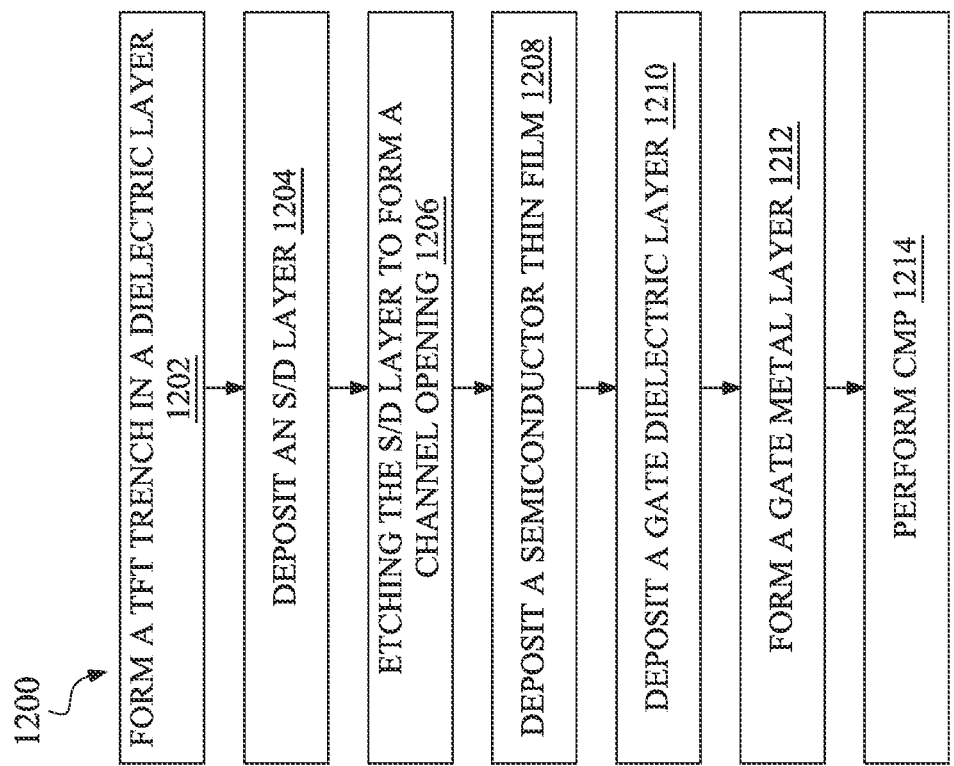
FIG. 12 is a flowchart diagram illustrating an example method of fabricating a TFT in accordance with some embodiments.

FIG. 12 is a flowchart diagram illustrating an example method 1200 of fabricating a TFT in accordance with some embodiments. FIGS. 13A-13F are schematic diagrams illustrating cross-sectional views of a TFT 1300 at various fabrication stages in accordance with some embodiments. The TFT 1300 is an equivalent to the TFT 802 of the RRAM device 803 and the TFT 102a of the RRAM device 103 as described above.

In the illustrated example of FIG. 12, the method 1200 includes operations 1202, 1204, 1206, 1208, 1210, 1212, and 1214. At operation 1202, a TFT trench (e.g., the TFT trench 1304 shown in FIG. 13A) is formed in a dielectric layer (e.g., the dielectric layer 1302 shown in FIG. 13A).

At operation 1204, an S/D layer is deposited on the dielectric layer. In some embodiments, the S/D layer includes a metal (e.g., tantalum (Ta)) or a metal nitride (e.g., tantalum nitride (TaN)). In the illustrated example of FIG. 13B, the S/D layer 882 includes a bottom portion 1305 that covers a bottom surface of the TNT trench 1304.

At operation 1206, the S/D layer is etched to form a channel opening. In the illustrated example of FIG. 13C, the channel opening 1306 is formed around a center of the bottom portion 1305 and vertically extends through an entire thickness of the bottom portion 1305. Accordingly, the first S/D region 882-1 and the second S/D region 882-2 are formed in the bottom portion of the S/D layer and isolated by the channel opening 1306.

At operation 1208, a semiconductor thin film is deposited. In some embodiments, the semiconductor thin film includes indium gallium zinc oxide (IGZO). IGZO is a semiconducting material, consisting of indium (In), gallium (Ga), zinc (Zn), and oxygen (O). IGZO-TFT has twenty to fifty times the electron mobility of amorphous silicon, which has often been used in liquid-crystal display (LCD) applications. It should be understood that other suitable semiconductor thin films may be employed in other embodiments. In some examples, the semiconductor thin film is made of an oxide semiconductor, such as indium tungsten oxide (InWO), indium zinc oxide (InZnO), indium tin oxide (InSnO), gallium oxide ($GaO_x$), indium oxide ($InO_x$), and the like. In the illustrated example of FIG. 13D, the semiconductor thin film 1308 is deposited on the S/D layer 882 and fills the channel opening 1306. The semiconductor thin film 1308 filled in the channel opening 1306 serves as the channel 883.

At operation 1210, a gate dielectric layer (e.g., the gate dielectric layer 1310 shown in FIG. 13D) is deposited on the semiconductor thin film. The gate dielectric layer may include a high-κ dielectric material.

At operation 1212, a gate metal layer (e.g., the gate metal layer 1312 shown in FIG. 13E) is deposited on the gate dielectric layer and fills the TFT trench.

At operation 1214, a CMP is performed. In the illustrated example of FIG. 13F, the CMP is performed on the gate metal layer 1312 until the S/D layer 882 is polished out (i.e., exposed). As such, the gate 881, which includes the gate metal layer 1310 and the gate dielectric layer 1310, is formed.

It should be understood that the TFTs 102a, 102b, and 802 shown in FIGS. 2 and 8 are exemplary rather than limiting, and other TFT structures, such as a gate-ail-around GAA (sometimes also referred to as a "surrounding gate") structure are within the contemplated scope of disclosure.

SUMMARY

In accordance with some aspects of the disclosure, a resistive random access memory (RRAM) device is provided. The RRAM device includes: a first bottom electrode via and a second bottom electrode via; a hard mask structure extending upwardly from a bottom surface to a top surface in a vertical direction, the hard mask structure having a first side wall and a second side wall; a first bottom electrode disposed on the first side wall, the first bottom electrode having a tapered shape and extending upwardly from a first bottom electrode surface to a first tip, the first bottom electrode surface being electrically connected to the first bottom electrode via; a second bottom electrode disposed on the second side wall, the second bottom electrode having a tapered shape and extending upwardly from a second bottom electrode surface to a second tip in the vertical direction, the second bottom electrode surface being electrically connected to the second bottom electrode via; a switching layer disposed on the hard mask structure, the first bottom electrode, and the second bottom electrode; and a top electrode disposed on the switching layer, the top electrode vertically aligned with the hard mask structure and distanced above the first bottom electrode and the second bottom electrode; wherein a first conductive path and a second conductive path are formed when a forming voltage is applied, wherein the first conductive path is in the switching layer between the first tip and the top electrode, and the second conductive path is in the switching layer between the second tip and the top electrode.

In accordance with some aspects of the disclosure, a method of fabricating a resistive random access memory (RRAM) device is provided. The method includes: forming a first bottom electrode via and a second bottom electrode via; forming a hard mask structure partially disposed on the first bottom electric via and the second bottom electrode via, the hard mask structure extending upwardly from a bottom surface to a top surface in a vertical direction and having a first side wall and a second side wall; forming a first bottom electrode and a second bottom electrode disposed on the first side wall and the second side wall of the hard mask structure, respectively, the first bottom electrode and the second bottom electrode each having a tapered shape; forming a switching layer disposed on the hard mask structure, the first bottom electrode, and the second bottom electrode; and forming a top electrode disposed on the switching layer, the top electrode vertically aligned with the hard mask structure and distanced above the first bottom electrode and the second bottom electrode.

In accordance with some aspects of the disclosure, a resistive random access memory (RRAM) device is provided. The RRAM includes: a bottom electrode via disposed in a first dielectric layer; a bottom electrode electrically connected to the bottom electrode via and protruding upwardly from the bottom electrode via in a vertical direction, wherein the bottom electrode has a tapered shape and includes a base portion extending upwardly from a bottom surface to an interface and a tip portion extending upwardly from the interface to a top surface; a top electrode disposed in a second dielectric layer, the top electrode distanced above and vertically aligned with the bottom electrode; and a switching layer disposed between the first dielectric layer and the second dielectric layer, the switching layer enclosing the bottom electrode, wherein a conductive path between the bottom electrode and the top electrode is formed when a forming voltage is applied.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device comprising:
    a first bottom electrode via and a second bottom electrode via;
    a hard mask structure extending upwardly from a bottom surface to a top surface in a vertical direction, the hard mask structure having a first side wall and a second side wall;
    a first bottom electrode disposed on the first side wall, the first bottom electrode having a tapered shape and extending upwardly from a first bottom electrode surface to a first tip, the first bottom electrode surface being electrically connected to the first bottom electrode via;
    a second bottom electrode disposed on the second side wall, the second bottom electrode having a tapered shape and extending upwardly from a second bottom electrode surface to a second tip in the vertical direction, the second bottom electrode surface being electrically connected to the second bottom electrode via;
    a switching layer disposed on the hard mask structure, the first bottom electrode, and the second bottom electrode; and
    a top electrode disposed on the switching layer, the top electrode vertically aligned with the hard mask structure and distanced above the first bottom electrode and the second bottom electrode;
    wherein a first conductive path and a second conductive path are formed when a forming voltage is applied, wherein the first conductive path is in the switching layer between the first tip and the top electrode, and the second conductive path is in the switching layer between the second tip and the top electrode.

2. The RRAM device of claim 1, wherein the first bottom electrode and the second bottom electrode each comprise titanium.

3. The RRAM device of claim 1, wherein the first bottom electrode and the second bottom electrode each comprise titanium nitride (TiN).

4. The RRAM device of claim 1, wherein the hard mask structure comprises silicon oxide.

5. The RRAM device of claim 1, wherein the first bottom electrode and the second bottom electrode are symmetric with respect to the vertical direction.

6. The RRAM device of claim 1, wherein the first bottom electrode and the second bottom electrode are below the top surface of the hard mask structure.

7. The RRAM device of claim 1, wherein the first bottom electrode and the second bottom electrode each have a vertical dimension of at least 1 nm.

8. The RRAM device of claim 1, wherein the hard mask structure has a horizontal dimension of at least 2 nm.

9. The RRAM device of claim 1, wherein the top electrode has a horizontal dimension of at least 2 nm.

10. The RRAM device of claim 1, wherein the switching layer comprises at least one of: zirconium dioxide ($ZrO_2$), tantalum oxide (TaO), titanium dioxide ($TiO_2$), hafnium oxide ($HfO_2$), aluminum oxide ($Al_2O_3$), copper oxide (CuO), zinc oxide (ZnO), tungsten trioxide ($WO_3$).

11. A resistive random access memory (RRAM) device comprising:
    a first bottom electrode via;
    a second bottom electrode via lateral to the first bottom electrode via;
    a hard mask structure having a first side wall and a second side wall and extending upwardly from a bottom surface to a top surface in a vertical direction;
    a first bottom electrode disposed on the first side wall, the first bottom electrode having a tapered shape and extending upwardly from a first bottom electrode surface to a first tip, the first bottom electrode surface being electrically connected to the first bottom electrode via;
    a second bottom electrode disposed on the second side wall, the second bottom electrode having a tapered shape and extending upwardly from a second bottom electrode surface to a second tip in the vertical direction, the second bottom electrode surface being electrically connected to the second bottom electrode via;
    a switching layer disposed on the hard mask structure, the first bottom electrode, and the second bottom electrode; and
    a top electrode disposed on the switching layer, the top electrode vertically aligned with the hard mask structure and distanced above the first bottom electrode and the second bottom electrode;
    wherein when a forming voltage is applied, a first conductive path in the switching layer between the first tip and the top electrode and a second conductive path in the switching layer between the second tip and the top electrode are formed.

12. The RRAM device of claim 11, wherein the first bottom electrode and the second bottom electrode each comprise titanium.

13. The RRAM device of claim 11, wherein the first bottom electrode and the second bottom electrode each comprise titanium nitride (TiN).

\* \* \* \* \*